(12) United States Patent
Arita et al.

(10) Patent No.: US 8,669,333 B2
(45) Date of Patent: Mar. 11, 2014

(54) THERMOSETTING RESIN COMPOSITION, CURED PRODUCT THEREOF, ACTIVE ESTER RESIN, SEMICONDUCTOR ENCAPSULATING MATERIAL, PREPREG, CIRCUIT BOARD, AND BUILD-UP FILM

(75) Inventors: Kazuo Arita, Ichihara (JP); Etsuko Suzuki, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/807,663

(22) PCT Filed: Jun. 8, 2011

(86) PCT No.: PCT/JP2011/063141
§ 371 (c)(1),
(2), (4) Date: Dec. 28, 2012

(87) PCT Pub. No.: WO2012/002119
PCT Pub. Date: Jan. 5, 2012

(65) Prior Publication Data
US 2013/0101857 A1 Apr. 25, 2013

(30) Foreign Application Priority Data
Jul. 2, 2010 (JP) .................................. 2010-151984

(51) Int. Cl.
*C08F 283/10* (2006.01)
(52) U.S. Cl.
USPC ........... 525/523; 428/413; 428/418; 528/190; 528/193; 528/194
(58) Field of Classification Search
USPC .................. 428/413, 414, 415, 416, 417, 418; 525/523; 528/176, 190, 193, 194
See application file for complete search history.

(56) References Cited

U.S. PATENT DOCUMENTS

2009/0069490 A1 3/2009 Ogura et al.
2009/0088535 A1* 4/2009 Arita et al. .................... 525/390

FOREIGN PATENT DOCUMENTS

| JP | 03-203925 A | | 9/1991 |
|---|---|---|---|
| JP | 07-082348 A | | 3/1995 |
| JP | 2006-307162 A | | 11/2006 |
| JP | 2007-262013 A | | 10/2007 |
| JP | 2008-031344 A | | 2/2008 |
| JP | 2008-291279 A | | 12/2008 |
| JP | 2009235165 A | * | 10/2009 |
| JP | 2011-099049 A | | 5/2011 |
| JP | 2012-012534 A | | 1/2012 |

OTHER PUBLICATIONS

Machine translation of JP 2009235165 (2013).*
Office Action mailed Mar. 15, 2012, issued for the Japanese patent application No. 2012-505918.
International Search Report dated Sep. 6, 2011, issued for PCT/JP2011/063141.

* cited by examiner

*Primary Examiner* — Callie Shosho
*Assistant Examiner* — John Freeman
(74) *Attorney, Agent, or Firm* — Edwards Wildman Palmer LLP

(57) ABSTRACT

A thermosetting resin composition contains an active ester resin (A) and an epoxy resin (B) as essential components, the active ester resin (A) having a resin structure which includes a polyaryleneoxy structure (I) and in which aromatic carbon atoms in a plurality of the polyaryleneoxy structures (I) are linked through a structural site (II) represented by a structural formula 1 (wherein Ar represents a phenylene group, a phenylene group nuclear-substituted by 1 to 3 alkyl groups each having 1 to 4 carbon atoms, a naphthylene group, or a naphthylene group nuclear-substituted by 1 to 3 alkyl groups each having 1 to 4 carbon atoms).

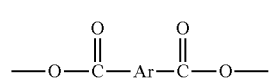

(1)

12 Claims, 6 Drawing Sheets

THERMOSETTING RESIN COMPOSITION, CURED PRODUCT THEREOF, ACTIVE ESTER RESIN, SEMICONDUCTOR ENCAPSULATING MATERIAL, PREPREG, CIRCUIT BOARD, AND BUILD-UP FILM

TECHNICAL FIELD

The present invention relates to a thermosetting resin composition which exhibits excellent flame retardancy and heat resistance, and low dielectric loss tangent when used in cured products and which has excellent performance of solvent solubility, and relates to cured products thereof, an active ester resin used in the resin composition, and a semiconductor encapsulating material, a prepreg, a circuit board, and a build-up film which are composed of the thermosetting resin composition.

BACKGROUND ART

Epoxy resin compositions each containing an epoxy resin and a curing agent therefor as essential components exhibit excellent heat resistance and insulation when used in cured products, and are thus widely used in application to electronic components such as semiconductors, multilayer printed circuit boards, etc.

In the application to electronic components, in the technical field of multilayer printed circuit board insulating materials, various electronic apparatuses have recently been increasing in speed and frequency of signals. However, it is becoming difficult to achieve low dielectric loss tangent while maintaining sufficiently low dielectric constant with increases in signal speed and frequency.

Therefore, it is desired to provide a thermosetting resin composition capable of producing cured products which exhibit sufficiently low dielectric loss tangent while maintaining sufficiently low dielectric constant for signals at higher speeds and higher frequencies. A technique known to provide materials capable of realizing such low dielectric constant and low dielectric loss tangent uses, as an epoxy resin curing agent, active ester compounds produced by aryl-esterifying phenolic hydroxyl groups in phenol novolac resins (refer to Patent Literature 1).

However, multilayer printed circuit-board insulating materials are required to have very high heat resistance due to the tendency for electronic components to have higher frequencies and smaller sizes, but the active ester compounds produced by aryl-esterifying phenolic hydroxyl groups in phenol novolac resins cause decreases in crosslinking density of cured products due to the aryl ester structures introduced therein, thereby imparting unsatisfactory heat resistance to cured products. Thus, it is difficult to achieve heat resistance and low dielectric constant/low dielectric loss tangent.

On the other hand, it is essential to deal with environmental issues such as the dioxin problem of insulating materials used in the field of semiconductors and multilayer printed circuit boards, and there has been increasing demand for a so-called halogen-free flame retardant system including a resin imparted with a flame retardant effect without using an addition-type halogen-based flame retardant. However, the active ester compounds produced by aryl-esterifying phenolic hydroxyl groups in phenol novolac resins improve dielectric characteristics but degrade flame retardancy of cured products because the compounds contain many combustible pendant-like aromatic hydrocarbon groups in the molecular structures thereof, thereby failing to structure the halogen-free flame retardant system.

CITATION LIST

Patent Literature

PTL 1: Japanese Unexamined Patent Application Publication No. 7-82348

SUMMARY OF INVENTION

Technical Problem

A problem is to provide a thermosetting resin composition which exhibits both excellent heat resistance and flame retardancy while maintaining a low dielectric constant and low dielectric loss tangent when formed into cured products, and provide cured products thereof, an active ester resin which causes the cured products to produce these properties, and a semiconductor encapsulating material, a prepreg, a circuit board, and a build-up film which are produced from the composition.

Solution to Problem

As a result of intensive research for solving the problem, the inventors of the present invention found that a cured product can be provided with both excellent heat resistance and flame retardancy while maintaining a low dielectric constant and low dielectric loss tangent by using a curing agent for an epoxy resin which has a polyaryleneoxy structure as a main skeleton and an active ester structural site introduced into an end thereof, leading to the achievement of the present invention.

That is, the present invention relates to a thermosetting resin composition including an active ester resin (A) and an epoxy resin (B) as essential components, the active ester resin (A) having a resin structure which includes a polyaryleneoxy structure (I) and in which aromatic carbon atoms in a plurality of the polyaryleneoxy structures (I) are linked through a structural site (II) represented by structural formula 1 below,

[Chem. 1]

Structural Formula 1

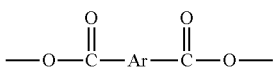

(wherein Ar represents a phenylene group, a phenylene group nuclear-substituted with 1 to 3 alkyl groups each having 1 to 4 carbon atoms, a naphthylene group, or a naphthylene group nuclear-substituted with 1 to 3 alkyl groups each having 1 to 4 carbon atoms).

Further, the present invention relates to a cured product produced by curing the thermosetting resin composition.

Further, the present invention relates to an active ester resin having a resin structure which includes a polyaryleneoxy structure (I) and in which aromatic carbon atoms in a plurality of the polyaryleneoxy structures (I) are linked through a structural site (II) represented by structural formula 1 below,

[Chem. 2]

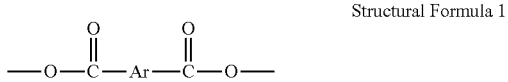
Structural Formula 1

(wherein Ar represents a phenylene group, a phenylene group nuclear-substituted with 1 to 3 alkyl groups each having 1 to 4 carbon atoms, a naphthylene group, or a naphthylene group nuclear-substituted with 1 to 3 alkyl groups each having 1 to 4 carbon atoms).

Further, the present invention relates to a semiconductor encapsulating material including a thermosetting resin composition further containing an inorganic filler (C) at a ratio f 70 to 95% by mass in the composition in addition to the active ester resin (A) and the epoxy resin (B) of the thermosetting resin composition.

Further, the present invention relates to a prepreg produced by impregnating a reinforcement substrate with the above-described thermosetting resin composition diluted with an organic solvent, and then semi-curing the resultant impregnated substrate.

Further, the present invention relates to a circuit board produced by diluting the thermosetting resin composition with an organic solvent to prepare a varnish, shaping the varnish into a plate, and molding the plate and a copper foil under heating and pressure.

Further, the present invention relates to a build-up film formed by applying the thermosetting resin composition diluted with an organic solvent to a base film and then drying the film.

Advantageous Effects of Invention

According to the present invention, it is possible to provide a thermosetting resin composition which exhibits excellent heat resistance and flame retardancy while maintaining a low dielectric constant and low dielectric loss tangent when formed into cured products, and provide cured products thereof, an active ester resin which causes the cured products to produce these properties, and a semiconductor encapsulating material, a prepreg, and a circuit board which are produced from the composition.

DESCRIPTION OF EMBODIMENTS

Figure 1:
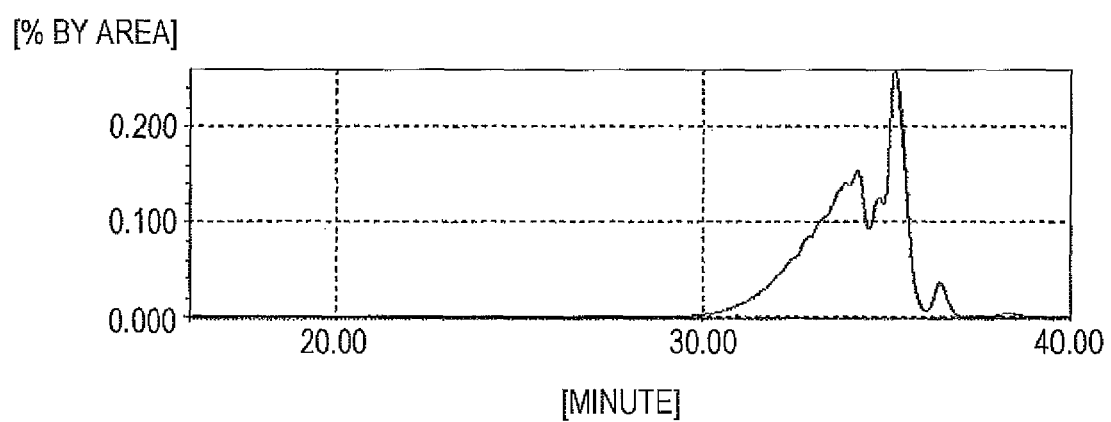
FIG. 1 is a GPC chart of phenolic hydroxyl group-containing resin (A-1) produced in Synthesis Example 1.

The present invention is described in detail below.

An active ester resin (A) used in a thermosetting resin composition of the present invention has a resin structure which includes a polyaryleneoxy structure (I) and in which aromatic carbon atoms in a plurality of the polyaryleneoxy structures (I) are linked through a structural site (II) represented by structural formula 1 below,

[Chem. 3]

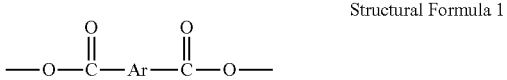
Structural Formula 1

(wherein Ar represents a phenylene group, a phenylene group nuclear-substituted with 1 to 3 alkyl groups each having 1 to 4 carbon atoms, a naphthylene group, or a naphthylene group nuclear-substituted with 1 to 3 alkyl groups each having 1 to 4 carbon atoms).

In the present invention, since a molecular main skeleton contains the polyaryleneoxy structure (I), excellent heat resistance and flame retardancy can be imparted to a cured product, and since the structures (I) are linked through the site represented by the structural formula 1, a cured product can be provided with excellent dielectric characteristics such as low dielectric constant and low dielectric loss tangent. It is a significant point that an active ester resin having a structure in which phenolic hydroxyl groups in a polyfunctional phenolic hydroxyl group-containing resin are substituted with arylcarbonyloxy groups is basically decreased in heat resistance and flame retardancy due to the arylcarbonyloxy groups, but substantially no decrease in heat resistance and flame retardancy is found in the present invention.

The above-described active ester resin (A) preferably has a softening point in a range of 120 to 200° C., particularly in a range of 120 to 190° C., particularly from the viewpoint of excellent heat resistance of a cured product.

Examples of the polyaryleneoxide structure (I) constituting the main skeleton of the active ester resin (A) include naphthyleneoxide-based structures such as a polynaphthyleneoxide structure, a polynaphthyleneoxide structure substituted with an alkyl group having 1 to 4 carbon atoms, and the like, phenyleneoxide-based structures such as a polyphenyleneoxide structure, a polyphenyleneoxide structure substituted with an alkyl group having 1 to 4 carbon atoms, and the like.

Specifically, the active ester resin (A) preferably has a resin structure including the polyaryleneoxy structure (I) with a molecular structure in which a structural site (α) is bonded as a substituent on an aromatic nucleus, the structural site (α) being represented by the following structural formula 2:

[Chem. 4]

Structural Formula 2

(wherein R$^1$ and R$^2$ each independently represent a methyl group or a hydrogen atom, Ar represents a phenylene group, a phenylene group nuclear-substituted with 1 to 3 alkyl groups each having 1 to 4 carbon atoms, a naphthylene group, or a naphthylene group nuclear-substituted with 1 to 3 alkyl groups each having 1 to 4 carbon atoms, and n is an integer of 1 or 2), and in the resin structure, aromatic carbon atoms in a plurality of the structures (I) are linked through the structural site (II) represented by the following structural formula 1:

[Chem. 5]

Structural Formula 1

(wherein Ar represents a phenylene group, a phenylene group nuclear-substituted with 1 to 3 alkyl groups each having 1 to 4 carbon atoms, a naphthylene group, or a naphthylene group nuclear-substituted with 1 to 3 alkyl groups each having 1 to 4 carbon atoms), the active ester resin (A) having a softening point in a range of 120° C. to 200° C. (hereinafter abbreviated as "active ester resin (a1)").

Alternatively, the active ester resin (A) preferably has a resin structure in which naphthylene ether structural sites (α) are bonded to each other through a structural site (β), the naphthylene ether structural sites (α) being represented by the following structural formula 3-1:

[Chem. 6]

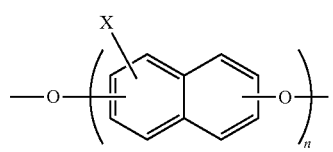

Structural Formula 3-1

(wherein X represents a hydrogen atom or a benzoylnaphthyl group, and n is an integer of 0 to 2), the structural site (β) being represented by the following structural formula 3-2:

[Chem. 7]

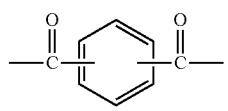

Structural Formula 3-2

In addition, the resin structure has hydrogen atoms, benzoyl groups, benzoylcarbonyl groups, or carboxyl groups at both ends (hereinafter abbreviated as "active ester resin (a2)").

These resin structures are preferred from the viewpoint of excellent flame retardancy, heat resistance, and dielectric characteristics of a cured product.

The active ester resin (a1) is described in detail below. The polyaryleneoxy structure present in the molecular structure of the active ester resin (a1) has, as a basic skeleton, a polyphenyleneoxy structure, a polynaphthyleneoxy structure, or the like, and has, as a substituent on an aromatic nucleus, a structural site (α) represented by the following structural formula 2:

[Chem. 8]

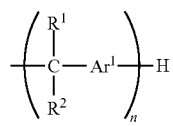

Structural Formula 2

(in the structural formula 1, $R^1$ and $R^2$ each independently represent a methyl group or a hydrogen atom, Ar represents a phenylene group, a phenylene group nuclear-substituted with 1 to 3 alkyl groups each having 1 to 4 carbon atoms, a naphthylene group, or a naphthylene group nuclear-substituted with 1 to 3 alkyl groups each having 1 to 4 carbon atoms, and n is an integer of 1 or 2). Examples of the structural site represented by the structural formula 2 include a benzyl group, a 1-phenylethyl group, a 2-phenylpropyl group, and a structural site in which a methyl group, an ethyl group, a propyl group, or a tert-butyl group is bonded to an aromatic nucleus of any one of the benzyl group, 1-phenylethyl group, 2-phenylpropyl group. Among these, a benzyl group is particularly preferred in view of heat resistance.

In addition, as described above, the active ester resin (a1) has the resin structure in which aromatic carbon atoms in a plurality of the structures (I) are linked to each other through the structural site (II) represented by the following structural formula 1:

[Chem. 9]

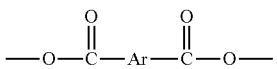

Structural Formula 1

(wherein Ar represents a phenylene group, a phenylene group nuclear-substituted with 1 to 3 alkyl groups each having 1 to 4 carbon atoms, a naphthylene group, or a naphthylene group nuclear-substituted with 1 to 3 alkyl groups each having 1 to 4 carbon atoms).

Examples of the structural site (II) represented by the structural formula 1 include benzene-1,2-dicarbonyloxy, benzene-1,3-dicarbonyloxy, benzene-1,4-dicarbonyloxy, naphthalene-2,6-dicarbonyloxy, naphthalene-2,7-dicarbonyloxy, and a structural site in which an alkyl group such as a methyl group, an ethyl group, a propyl group, a tert-butyl group, or the like is bonded to an aromatic nucleus of any one of these dicarbonyloxy groups. Among these, in view of solvent solubility, benzene-1,2-dicarbonyloxy, benzene-1,3-dicarbonyloxy, or benzene-1,4-dicarbonyloxy is particularly preferred.

When the active ester resin has a molecular structure in which a plurality of the polyaryleneoxy structures (I) are linked through the structural site (II), molecular ends have phenolic hydroxyl groups due to the polyaryleneoxy structure or carboxyl groups due to the structural site (II) depending on the production method. In the present invention, the active ester resin (a1) may have phenolic hydroxyl groups or carboxyl groups, but when the molecular ends have phenolic hydroxyl groups, the molecular structure is preferably one in which the phenolic hydroxyl groups are aromatic-esterified with benzoic acid, alkylbenzoic acid such as phenylbenzoic acid, methylbenzoic acid, ethylbenzoic acid, n-propylbenzoic acid, i-propylbenzoic acid, tert-butylbenzoic acid, or the like, or an acid halide of any one of these acids, such as an acid fluoride, an acid chloride, an acid bromide, an acid iodide, or the like. On the other hand, the molecular ends have carboxyl groups, the molecular structure is preferably one in which the carboxyl groups are esterified by reaction with a monohydric phenol compound such as phenol, cresol, p-tert-butylphenol, 1-naphthol, 2-naphthol, or the like.

The active ester resin (a1) can be produced by reacting a phenolic hydroxyl group-containing resin (a1-1) with an aromatic dicarboxylic acid or aromatic dicarboxylic acid chloride (a1-2), the phenolic hydroxyl group-containing resin (a1-1) being a phenolic hydroxyl group-containing resin having the polyaryleneoxy structure as a main skeleton and a molecular structure in which a structural site (α) is bonded as a substituent on an aromatic nucleus, the structural site (α) being represented by the following structural formula 2:

[Chem. 10]

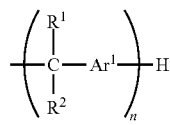

Structural Formula 2

(in the structural formula 2, $R^1$ and $R^2$ each independently represent a methyl group or a hydrogen atom, Ar represents a phenylene group, a phenylene group nuclear-substituted with 1 to 3 alkyl groups each having 1 to 4 carbon atoms, a naphthylene group, or a naphthylene group nuclear-substituted with 1 to 3 alkyl groups each having 1 to 4 carbon atoms, and n is an integer of 1 or 2).

In addition, when the active ester resin (a1) has arylcarbonyloxy groups at its molecular ends, a method for producing the active ester resin (a1) is to simultaneously react the phenolic hydroxyl group-containing resin (a1-1), the aromatic dicarboxylic acid or aromatic dicarboxylic acid chloride (a1-2), and a monofunctional aromatic carboxylic acid or its chloride (a1-3) or to react the phenolic hydroxyl group-containing resin (a1-1) with the monofunctional aromatic carboxylic acid or its chloride (a1-3) and then react the reaction product with the aromatic dicarboxylic acid or aromatic dicarboxylic acid chloride (a1-2).

In addition, when the active ester resin (a1) has aryloxycarbonyl groups at its molecular ends, a method for producing the active ester resin (a1) is to react the phenolic hydroxyl group-containing resin (a1-1), the aromatic dicarboxylic acid or aromatic dicarboxylic acid chloride (a1-2), and a monohydric phenol compound (a1-4).

In particular, in the present invention, in view of the ease of control of the functional group concentration as an active ester compound, the active ester resin (a1) is preferably produced by reacting a phenolic hydroxyl group-containing resin (a1-1) with a monofunctional aromatic carboxylic acid or its chloride (a1-3) so as to leave phenolic hydroxyl groups in the resin (a1-1) and then reacting the reaction product with an aromatic dicarboxylic acid or aromatic dicarboxylic acid chloride (a1-2), the phenolic hydroxyl group-containing resin (a1-1) being a phenolic hydroxyl group-containing resin having the polyaryleneoxy structure as a main skeleton and a molecular structure in which a structural site (α) represented by structural formula 2 below is bonded as a substituent on an aromatic nucleus,

[Chem. 11]

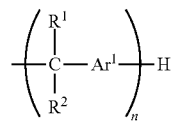

Structural Formula 2

(in the structural formula 2, $R^1$ and $R^2$ each independently represent a methyl group or a hydrogen atom, Ar represents a phenylene group, a phenylene group nuclear-substituted with 1 to 3 alkyl groups each having 1 to 4 carbon atoms, a naphthylene group, or a naphthylene group nuclear-substituted with 1 to 3 alkyl groups each having 1 to 4 carbon atoms, and n is an integer of 1 or 2). In addition, from the viewpoint of good heat resistance of the resultant active ester resin (a1), the active ester resin (a1) is preferably produced by reacting the phenolic hydroxyl group-containing resin (a1-1) with a mixture of the monofunctional aromatic carboxylic acid or its chloride (a1-3) and the aromatic dicarboxylic acid or aromatic dicarboxylic acid chloride (a1-2) so as to react phenolic hydroxyl groups in the resin (a1-1), the phenolic hydroxyl group-containing resin (a1-1) being a phenolic hydroxyl group-containing resin having the polyaryleneoxy structure as a main skeleton and a molecular structure in which a structural site (α) represented by structural formula 2 below is bonded as a substituent on an aromatic nucleus,

[Chem. 12]

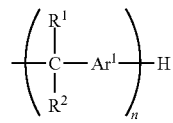

Structural Formula 2

(in the structural formula 2, $R^1$ and $R^2$ each independently represent a methyl group or a hydrogen atom, Ar represents a phenylene group, a phenylene group nuclear-substituted with 1 to 3 alkyl groups each having 1 to 4 carbon atoms, a naphthylene group, or a naphthylene group nuclear-substituted with 1 to 3 alkyl groups each having 1 to 4 carbon atoms, and n is an integer of 1 or 2).

Specifically, in the phenolic hydroxyl group-containing resin (a1-1) used, preferably, aromatic nuclei constituting the molecular structure (α) are present at a ratio in a range of 0.1 to 1.0 mole per mole of aromatic nuclei constituting the polyaryleneoxy structure, and the softening point of the resin (1a-1) is in a range of 70° C. to 200° C. That is, when the aromatic nuclei constituting the molecular structure (α) are present at a ratio of 1.0 or less per mole of aromatic nuclei constituting the polyaryleneoxy structure, the heat resistance of a cured product is significantly improved, and flame retardancy is also enhanced. On the other hand, when the ratio is 0.1 or more, the flame retardancy of a cured product is improved, and the dielectric loss tangent of a cured product is also decreased. The presence ratio of aromatic nuclei constituting the molecular structure per mole of aromatic nuclei constituting the polyaryleneoxy structure in the phenolic hydroxyl group-containing resin (a1-1) corresponds to the number of moles of the aralkylating agent (a2) per mole of the dihydroxy aromatic compound (a1) in the method for producing the phenolic hydroxyl group-containing resin (a1-1) as described above.

In addition, when the phenolic hydroxyl group-containing resin (a1-1) has a softening point in a range of 70° C. to 200°

C., the resultant final active ester resin (a1) has high solubility in organic solvents and thus provides a material suitable for varnish for circuit boards, and nonconventional flame retardant performance can be exhibited because the polyaryleneoxy structure has a relatively long main chain.

As described above, the phenolic hydroxyl group-containing resin (a1-1) is characterized in that the softening point is high, and the aromatic nuclei constituting the molecular structure (α) are present at a low ratio despite the high softening point. The polyaryleneoxy structure has a relatively long main chain, excellent solvent solubility is exhibited, and it is possible to comply with high flame retardant performance in application to circuit boards.

The phenolic hydroxyl group-containing resin (a1-1) preferably has a hydroxyl equivalent in a range of 100 to 220 g/eq., particularly in a range of 120 to 220 g/eq., from the viewpoint that the resultant active ester resin has the excellent effect of improving dielectric characteristics and moisture resistance after being cured and also has excellent fluidity.

As described above, the phenolic hydroxyl group-containing resin (a1-1) having a polynaphthyleneoxy structure as the polyaryleneoxide structure (I) is preferred because it exhibits the excellent flame retardant effect and has low dielectric loss tangent. Specifically, the phenolic hydroxyl group-containing resin (a1-1) is preferably a phenolic hydroxyl group-containing resin having a structural unit (I') as a repeating unit represented by general formula (1') below.

[Chem. 13]

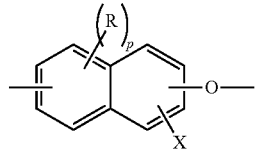

General Formula (1')

Also, the phenolic hydroxyl group-containing resin preferably has phenolic hydroxyl groups at both ends and a softening point of 70° C. to 200° C. in view of excellent solubility in organic solvents and excellent flame retardancy and heat resistance of a cured product.

In the general formula (1'), X represents a hydrogen atom or a structural site represented by the following general formula (1"):

[Chem. 14]

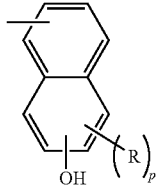

General Formula (1")

In the general formula (1') and general formula (1"), R represents a structural site (α') represented by the following general formula (2'):

[Chem. 15]

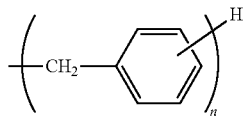

General Formula (2')

In the general formula (2'), n is 1 or 2, and in the general formula (1"), a p value is an integer of 0 to 3. However, the phenolic hydroxyl group-containing resin (a1-1) has the structural site (α') at a ratio of 0.1 to 1.0 in terms of number of sites per naphthalene ring in the molecular structure.

In the general formula (1'), a bonding position to a naphthalene skeleton may be any one of the two rings constituting the naphthalene ring. When the ratio of the structural site (α') present in the phenolic hydroxyl group-containing resin (a1-1) is 1.0 or less in terms of number of sites per naphthalene skeleton, the heat resistance of a cured product is significantly improved, and flame retardancy is enhanced. On the other hand, when the ratio is 0.1 or more, the flame retardancy of a cured product is improved, and the dielectric loss tangent of a cured product is decreased. In addition, the ratio of the structural site (α') present relative to the naphthalene skeleton corresponds to the number of moles of the aralkylating agent per mole of dihydroxynaphthalene in the production method as described above.

The phenolic hydroxyl group-containing resin (a1-1) can be produced by a method of reacting a dihydroxy aromatic compound with an aralkylating agent in the presence of an acid catalyst.

Specifically, reaction of the dihydroxy aromatic compound with the aralkylating agent in the presence of an acid catalyst can produce the phenolic hydroxyl group-containing resin (a1-1) having a structure in which a polyarylene structure serving as a main skeleton has phenolic hydroxyl groups at both ends and an aralkyl group is bonded in a pendant form to an aromatic nucleus of the polyarylene structure.

The reaction ratio (dihydroxy aromatic compound/aralkylating agent) on a molar basis of the dihydroxy aromatic compound to the aralkylating agent is preferably in a range of 1/0.1 to 1/1.0 from the viewpoint of good balance between flame retardancy and heat resistance of the final resultant active ester resin.

Examples of the dihydroxy aromatic compound which can be used include dihydric phenols such as catechol, resorcinol, hydroquinone, and the like; and dihydroxynaphthalene such as 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, 2,7-dihydroxynaphthalene, and the like. Among these, dihydroxynaphthalene, 1,6-dihydroxynaphthalene or 2,7-dihydroxynaphthalene, particularly 2,7-dihydroxynaphthalene, is preferred in the view of further improved flame retardancy of a cured product of the final resultant active ester resin (A) and low dielectric loss tangent and good dielectric characteristics of the cured product.

Examples of the aralkylating agent include benzyl chloride, benzyl bromide, benzyl iodide, o-methylbenzyl chloride, m-methylbenzyl chloride, p-methylbenzyl chloride, p-ethylbenzyl chloride, p-isopropylbenzyl chloride, p-tert-butylbenzyl chloride, p-phenylbenzyl chloride, 5-chloromethylacenaphthylene, 2-naphthylmethyl chloride, 1-chloromethyl-2-naphthalene, and nuclear-substituted isomers thereof, α-methylbenzyl chloride, α,α-dimethylbenzyl chloride, and the like; benzyl methyl ether, o-methylbenzyl methyl ether, m-methylbenzyl methyl ether, p-methylbenzyl methyl ether, p-ethylbenzyl methyl ether, and nuclear-substituted isomers thereof, benzyl ethyl ether, benzyl propyl ether, benzyl isobutyl ether, benzyl n-butyl ether, p-methylbenzyl methyl ether, and nuclear-substituted isomers thereof, and the like; benzyl alcohol, o-methylbenzyl alcohol, m-methylbenzyl alcohol, p-methylbenzyl alcohol, p-ethylbenzyl alcohol, p-isopropylbenzyl alcohol, p-tert-butylbenzyl alcohol, p-phenylbenzyl alcohol, α-naphthyl carbinol, and nuclear-substituted isomers thereof, α-methylbenzyl alcohol, α,α-dimethylbenzyl alcohol, and the like; styrene, o-methylstyrene, m-methylstyrene, p-methylstyrene, α-methylstyrene, β-methylstyrene, and the like.

Among these, benzyl chloride, benzyl bromide, and benzyl alcohol are particularly preferred in view of the more significant flame retardant effect of a cured product of the final resultant active ester resin.

Examples of the acid catalyst which can be used in the reaction of the dihydroxy aromatic compound with the aralkylating agent include inorganic acids such as phosphoric acid, sulfuric acid, hydrochloric acid, and the like; organic acids such as oxalic acid, benzenesulfonic acid, toluenesulfonic acid, methanesulfonic acid, fluoromethanesulfonic acid, and the like, Friedel-Crafts catalysts such as aluminum chloride, zinc chloride, stannic chloride, ferric chloride, diethyl sulfate, and the like.

In addition, the amount of the acid catalyst used can be appropriately selected according to the target modification rate, but, for example, the amount of inorganic acid or organic acid used is in a range of 0.001 to 5.0 parts by mass, preferably 0.01 to 3.0 parts by mass, relative to 100 parts by mass of the dihydroxy aromatic compound, and the amount of Friedel-Crafts catalyst used is in a range of 0.2 to 3.0 moles, preferably 0.5 to 2.0 moles, per mole of the dihydroxy aromatic compound.

The reaction of the dihydroxy aromatic compound with the aralkylating agent is preferably performed by using an organic solvent in view of the point that the molecular weight is increased, and the softening point is easily controlled.

Specifically, in view of the high softening point of the resultant phenolic hydroxyl group-containing resin (a1-1), the reaction is preferably performed by a method including dissolving the dihydroxy aromatic compound, the aralkylating agent, and the acid catalyst in the presence of the organic solvent, reacting them under a temperature condition of 100° C. to 140° C. for a time of ½ to ⅔ the total reaction time, and then reacting them at a temperature increased to 140° C. to 180° C.

On the other hand, examples of the aromatic dicarboxylic acid or aromatic dicarboxylic acid chloride (a1-2) include phthalic acid, isophthalic acid, terephthalic acid, 2,6-naphthalenedicarboxylic acid, 1,6-naphthalenedicarboxylic acid, 2,7-naphthalenedicarboxylic acid, and acid chlorides thereof. Among these, isophthalic acid chloride and terephthalic acid chloride are particularly preferred from the viewpoint of balance between solvent solubility and heat resistance.

In addition, when the phenolic hydroxyl group-containing resin (a1-1) is further reacted with the monofunctional aromatic carboxylic acid or its chloride (a1-3) or the monohydric phenolic compound (a1-4) in addition to the aromatic dicarboxylic acid or aromatic dicarboxylic acid chloride (a1-2), examples of the monofunctional aromatic carboxylic acid or its chloride (a1-3) include benzoic acid, alkylbenzoic acids such as phenylbenzoic acid, methylbenzoic acid, ethylbenzoic acid, n-propylbenzoic acid, i-propylbenzoic acid, tert-butylbenzoic acid, and the like, and acid halides of these acids, such as acid fluorides, acid chlorides, acid bromides, acid iodides, and the like. In view of good reactivity with the phenolic hydroxyl groups in the phenolic hydroxyl group-containing resin (a1-1), benzoic acid chloride or alkylbenzoic acid chlorides are preferred. On the other hand, examples of the monohydric phenolic compound (a1-4) include phenol, cresol, p-tert-butylphenol, 1-naphthol, 2-naphthol, and the like. Among these, phenol, cresol, and 1-naphthol are preferred in view of good reactivity with carboxyl groups or acid anhydride groups.

As described above, the active ester resin (a1) can be produced by methods 1 to 4 described below. The method 1 produces the active ester resin (a1) having phenolic hydroxyl groups or carboxyl groups at the molecular ends, the method 2 or 3 produces the active ester resin (a1) having arylcarbonyloxy groups at the molecular ends, and the method 4 produces the active ester resin (a1) having aryloxycarbonyl groups at the molecular ends.

Method 1: a method of reacting the phenolic hydroxyl group-containing resin (a1-1) with the aromatic dicarboxylic acid or aromatic dicarboxylic acid chloride (a1-2).

Method 2: a method of reacting the phenolic hydroxyl group-containing resin (a1-1) with the aromatic dicarboxylic acid or aromatic dicarboxylic acid chloride (a1-2) and the monofunctional aromatic carboxylic acid or its chloride (a1-3).

Method 3: a method of reacting the phenolic hydroxyl group-containing resin (a1-1) with the monofunctional aromatic carboxylic acid or its chloride (a1-3) and then reacting the reaction product with the aromatic dicarboxylic acid or aromatic dicarboxylic acid chloride (a1-2).

Method 4: a method of reacting the phenolic hydroxyl group-containing resin (a1-1) with the aromatic dicarboxylic acid or aromatic dicarboxylic acid chloride (a1-2) and the monohydric phenolic compound (a1-4).

An example of the method 1 is a method in which the phenolic hydroxyl group-containing resin (a1-1) is reacted with the aromatic dicarboxylic acid or aromatic dicarboxylic acid chloride (a1-2) under a basic catalyst. In addition, the reaction ratio of the phenolic hydroxyl group-containing resin (a1-1) to the aromatic dicarboxylic acid or aromatic dicarboxylic acid chloride (a1-2) is preferably 1.0/0.1 to 1.0/1.0 in terms of molar ratio [(a1-1)/(a1-2)] of both in view of solvent solubility.

An example of the method 2 is a method in which the phenolic hydroxyl group-containing resin (a1-1) is reacted with the aromatic dicarboxylic acid or aromatic dicarboxylic acid chloride (a1-2) and the monofunctional aromatic carboxylic acid or its chloride (a1-3) in the presence of a basic catalyst. In addition, in view of heat resistance, the reaction ratio is preferably in a range of 0.05/1.0 to 0.6/1.0 in terms of equivalent ratio [acid (or halide)/OH] of carboxyl group or halide thereof in the aromatic dicarboxylic acid or aromatic dicarboxylic acid chloride (a1-2) to hydroxyl groups in the phenolic hydroxyl group-containing resin (a1-1), and is in a range of 0.4/1.0 to 0.95/1.0 in terms of equivalent ratio [acid (or halide)/OH] of carboxyl group or halide thereof in the monofunctional aromatic carboxylic acid or its chloride (a1-3) to hydroxyl groups in the phenolic hydroxyl group-containing resin (a1-1).

An example of the method 3 is a method in which the phenolic hydroxyl group-containing resin (a1-1) is reacted with the monofunctional aromatic carboxylic acid or its chloride (a1-3) in the presence of a basic catalyst so that the equivalent ratio [acid (or halide)/OH] is in a range of 0.4/1.0 to 0.95/1.0, and then the resultant intermediate is reacted with the aromatic dicarboxylic acid or aromatic dicarboxylic acid chloride (a1-2) in the presence of a basic catalyst so that the equivalent ratio [acid (or halide)/OH] of carboxyl group or halide thereof in the aromatic dicarboxylic acid or aromatic dicarboxylic acid chloride (a1-2) to hydroxyl groups in the phenolic hydroxyl group-containing resin (a1-1) is in a range of 0.05/1.0 to 0.6/1.0.

An example of the method 4 is a method in which the phenolic hydroxyl group-containing resin (a1-1) is reacted with the aromatic dicarboxylic acid or aromatic dicarboxylic acid chloride (a1-2) and the monohydric phenolic compound (a1-4) in the presence of a basic catalyst. In addition, in view of balance between solvent solubility and heat resistance, the reaction ratio is preferably in a range of 1.25/1.0 to 2.0/1.0 in terms of equivalent ratio [acid (or halide)/OH] of carboxyl group or halide thereof in the aromatic dicarboxylic acid or aromatic dicarboxylic acid chloride (a1-2) to hydroxyl groups in the phenolic hydroxyl group-containing resin (a1-1), and is in a range of 0.25/1.0 to 2.0/1.0 in terms of equivalent ratio [phenolic hydroxyl group/OH in (a1-1)] of phenolic hydroxyl group in the monohydric phenolic compound (a1-4) to hydroxyl groups in the phenolic hydroxyl group-containing resin (a1-1).

Examples of an alkali catalyst which can be used in the methods 1 to 4 include sodium hydroxide, potassium hydroxide, triethylamine, pyridine, and the like. Among these, sodium hydroxide and potassium hydroxide are particularly preferred in view of the point that they can be used in the form of an aqueous solution, and productivity is improved.

In the reaction by the methods 1 to 4, each of the raw material components is preferably dissolved in an organic solvent and subjected to the reaction, and toluene, dichloromethane, or the like can be used as the organic solvent.

Among the methods 1 to 4, the method 2 is particularly preferred in view of excellent heat resistance of the resultant active ester resin, and the method 3 is particularly preferred in view of easy adjustment of the concentration of an active ester structural part.

The active ester resin (a1) produced as described above preferably has a softening point of 120° C. to 200° C. from the viewpoint that solubility in organic solvents is enhanced, thereby making a material suitable for varnish for circuit boards, and nonconventional flame retardant performance can be exhibited because of the relatively long main chain of the polyaryleneoxy structure.

Further, in producing the phenolic hydroxyl group-containing resin (a1-1) as a precursor of the active ester resin (a1), it is desired to form a polyaryleneoxide structure using a dihydroxy aromatic compound as a raw material. In this case, the phenolic hydroxyl group-containing resin (a1-1) is mainly produced as a linear active ester resin. However, the resin components may contain a component produced by active esterification of a multifunctional phenolic hydroxyl group-containing resin having a molecular structure in which another hydroxynaphthalene ring is directly bonded to a naphthalene ring in a polynaphthyleneoxide structure. Therefore, in this case, the active ester resin (a1) is produced as a branched active ester resin. When the active ester resin (a1) is used for application to circuit boards, the concentration of functional groups in the active ester resin (a1) is preferably further decreased to attempt to improve dielectric characteristics and moisture resistance after curing. When the molecular weight of the active ester resin (a1) is increased, the concentration of functional groups is decreased to improve the dielectric characteristics and moisture resistance of a cured product, and solubility in organic solvent is improved to make a material suitable for varnish for circuit boards. On the other hand, when the concentration of functional groups in the active ester resin (a1) is excessively decreased, curability deteriorates, and the crosslinking density of a cured product is decreased, thereby decreasing the effect of improving heat resistance after curing. Therefore, in view of heat resistance, the active ester resin (a1) preferably contains carbonyloxy groups, which constitute the ester, with an equivalent in a range of 220 to 350 g/eq., and particularly preferably in a range of 220 to 300 g/eq.

Next, as described above, the active ester resin (a2) has a resin structure in which the naphthylene ether structural sites (α) represented by structural formula 3-1 below are bonded to each other through the structural site (β) represented by structural formula 3-2.

Structural formula 3-1

[Chem. 16]

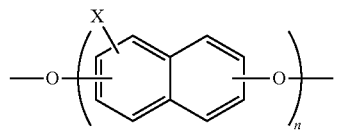

Structural Formula 3-1

(wherein X represents a hydrogen atom or a benzoylnaphthyl group, and n is an integer of 1 to 3.)

[Chem. 17]

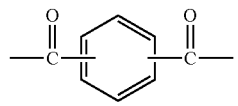

Structural Formula 3-2

In a case of having a molecular structure in which a plurality of the naphthylene ether structural sites (α) are linked to each other through the structural site (β), the molecular ends have phenolic hydroxyl groups resulting from the structural site (α) or carboxyl groups resulting from the structural site (β) depending on the production method. In the present invention, the active ester resin (a2) may have phenolic hydroxyl groups or carboxyl groups, but when the molecular ends have phenolic hydroxyl groups, the active ester resin (a2) preferably has a structure in which the phenolic hydroxyl groups are aromatic-esterified with benzoic acid, alkylbenzoic acid such as phenylbenzoic acid, methylbenzoic acid, ethylbenzoic acid, n-propylbenzoic acid, i-propylbenzoic acid, tert-butylbenzoic acid, or the like, or an acid halide of the acid, such as acid fluoride, acid chloride, acid bromide, acid iodide, or the like. On the other hand, when the molecular ends have carboxyl groups, the active ester resin (a2) preferably has a structure in which the carboxyl groups are esterified by reaction with a monohydric phenol such as phenol, cresol, p-tert-butylphenol, 1-naphthol, 2-naphthol, or the like.

Specifically, the naphthylene ether structural site (α) represented by the structural formula 3-1 preferably has oxy groups bonded at 1- and 6-positions or 2- and 7-positions in a naphthalene structure, and the structural site (β) represented by the structural formula 3-2 preferably has oxy groups bonded at 1- and 3-positions in a phenylene group. Therefore, preferred examples of the active ester resin (a2) include those represented by structural formulae E-1 to E-3 below.

[Chem. 18]

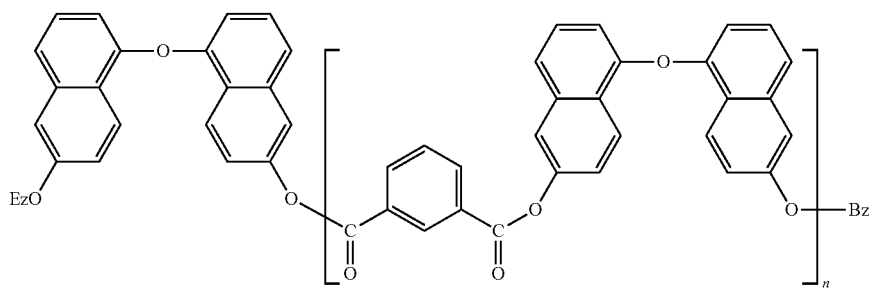

E-1

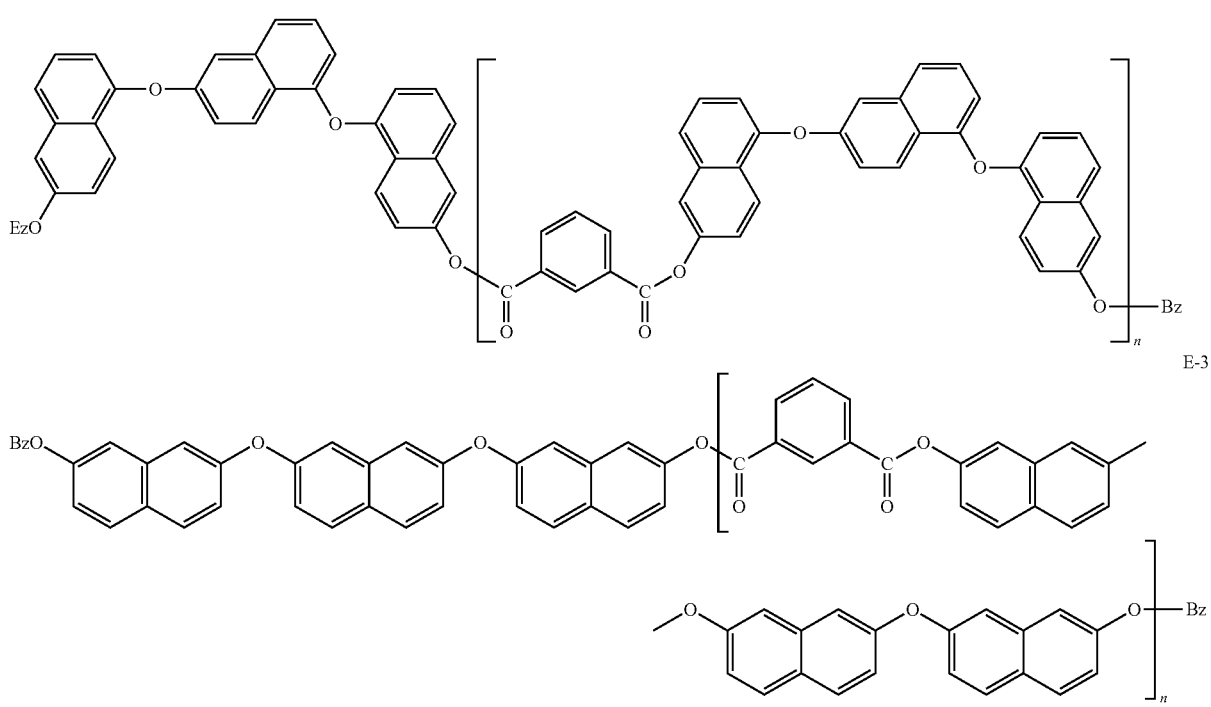

E-2

E-3

In the structural formulae E-1 to E-3, "Bz" represents a benzoyl group.

The above-detailed active ester resin (a2) can be produced by, for example, reacting a phenolic hydroxyl group-containing resin (a2-1), which is polynaphthylene ether, with the aromatic dicarboxylic acid or aromatic dicarboxylic acid chloride (a1-2). As described above, in addition to the aromatic dicarboxylic acid or aromatic dicarboxylic acid chloride (a1-2), the phenolic hydroxyl group-containing resin (a2-1) is further reacted with the monofunctional aromatic carboxylic acid or its chloride (a1-3) or the monohydric phenolic compound (a1-4) so as to esterify the molecular ends. This is preferred in view of excellent dielectric characteristics of a cured product.

A method for producing the phenolic hydroxyl group-containing resin (a2-1) which is polynaphthylene ether is, for example, a method of reacting dihydroxynaphthalene in the presence of an acid catalyst and then repeatedly extracting low-molecular compounds with an organic solvent, or a method of reacting dihydroxynaphthalene in the presence of a basic catalyst. In the present invention, the latter method of both methods is preferred from the viewpoint of excellent productivity.

Examples of the dihydroxynaphthalene used for producing the phenolic hydroxyl group-containing resin (a2-1) include 1,3-dihydroxynaphthalene, 1,6-dihydroxynaphthalene, 1,7-dihydroxynaphthalene, 1,8-dihydroxynaphthalene, 2,3-dihydroxynaphthalene, 2,7-dihydroxynaphthalene, and the like. Among these, 1,6-dihydroxynaphthalene and 2,7-dihydroxynaphthalene, particularly 2,7-dihydroxynaphthalene, is preferred in view of excellent curability of the final resultant active ester resin (a2) and excellent flame retardancy of the cured product.

Examples of the basic catalyst used for producing the phenolic hydroxyl group-containing resin (a2-1) include alkali metal hydroxides such as sodium hydroxide, potassium hydroxide, and the like; alkali metal carbonates such as sodium carbonate, potassium carbonate, and the like; and phosphorus-based compounds such as triphenyl phosphine and the like. These basic catalysts can be used alone or in combination of two or more.

Next, examples of the aromatic dicarboxylic acid or aromatic dicarboxylic acid chloride (a1-2) to be reacted with the resulting phenolic hydroxyl group-containing resin (a2-1) include phthalic acid, isophthalic acid, terephthalic acid, 2,6-naphthalenedicarboxylic acid, 1,6-naphthalenedicarboxylic acid, 2,7-naphthalenedicarboxylic acid, and acid chlorides thereof. Among these, isophthalic acid chloride and terephthalic acid chloride are particularly preferred in view of balance between solvent solubility and heat resistance.

When in addition to the aromatic dicarboxylic acid or aromatic dicarboxylic acid chloride (a1-2), the phenolic hydroxyl group-containing resin (a2-1) is further reacted with the monofunctional aromatic carboxylic acid or its chloride (a1-3) or the monohydric phenolic compound (a1-4), examples of the monofunctional aromatic carboxylic acid or its chloride (a1-3) include benzoic acid, alkylbenzoic acids such as phenylbenzoic acid, methylbenzoic acid, ethylbenzoic acid, n-propylbenzoic acid, i-propylbenzoic acid, tert-butylbenzoic acid, and the like; acid halides of these acids, such as an acid fluoride, an acid chloride, an acid bromide, an acid iodide, and the like. In view of good reactivity with phenolic hydroxyl groups in the phenolic hydroxyl group-containing resin (a1-1), benzoic acid chloride and alkylbenzoic acid chlorides are preferred. On the other hand, examples of the monohydric phenolic compound (a1-4) include phenol, cresol, p-tert-butylphenol, 1-naphthol, 2-naphthol, and the like. Among these, phenol, cresol, and 1-naphthol are preferred in view of good reactivity with carboxyl groups or acid anhydride groups.

As a method for reacting the phenolic hydroxyl group-containing resin (a2-1) with the aromatic dicarboxylic acid or aromatic dicarboxylic acid chloride (a1-2) and preferably further reacting with the monofunctional aromatic carboxylic acid or its chloride (a1-3) or the monohydric phenolic compound (a1-4), for example, these components can be reacted in the presence of an alkali catalyst.

Examples of the alkali catalyst which can be used in the reaction include sodium hydroxide, potassium hydroxide, triethylamine, pyridine, and the like. Among these, sodium hydroxide and potassium hydroxide are particularly preferred in view of the point that they can be used in the form of an aqueous solution, and productivity is improved.

Specifically, a method for the reaction includes mixing the components in the presence of an organic solvent and performing reaction while continuously or intermittently adding dropwise the alkali catalyst or an aqueous solution thereof. In this case, the concentration of the alkali catalyst in the aqueous solution is preferably in a range of 3.0 to 30% by mass. Examples of the organic solvent which can be used in the reaction include toluene, dichloromethane, and the like.

When the aqueous solution of the alkali catalyst is used, after the completion of reaction, the intended resin can be obtained by standing liquid-liquid separation to remove an aqueous layer and then repeatedly washing the residual organic layer until the aqueous layer becomes substantially neutral.

The active ester resin (a2) produced as described above preferably has a softening point of 120° C. to 200° C. from the viewpoint that the resin has higher solubility in organic solvents and thus becomes a material suitable for varnish for circuit boards, and nonconventional flame retardant performance can be exhibited because the polyaryleneoxy structure has a relatively long main chain.

The above-detailed active ester resin (a2) has a resin structure in which carbonyloxy groups constituting ester and phenolic hydroxyl groups preferably have a number of functional group equivalent in a range of 220 to 300 g/eq. in view of excellent solubility in organic solvents and excellent heat resistance of a cured product.

As described above, the active ester resin (a1) and the active ester resin (a2) can be used as the active ester resin (A) in the present invention, but in the present invention, the active ester resin (a1) is particularly preferred in view of the large effect of improving flame retardancy.

Next, examples of the epoxy resin (B) used in the thermosetting resin composition of the present invention include bisphenol A epoxy resins, bisphenol F epoxy resins, biphenyl epoxy resins, tetramethylbiphenyl epoxy resins, phenol novolac epoxy resins, cresol novolac epoxy resins, triphenylmethane epoxy resins, tetraphenylethane epoxy resins, dicyclopentadiene-phenol addition reaction-type epoxy resins, phenyl aralkyl epoxy resins, naphthol novolac epoxy resins, naphthol novolac epoxy resins, naphthol aralkyl epoxy resins, naphthol-phenol co-condensed novolac epoxy resins, naphthol-cresol co-condensed novolac epoxy resins, aromatic hydrocarbon formaldehyde resin-modified phenol resin-type epoxy resins, biphenyl-modified novolac epoxy resins, and the like. Among these epoxy resins, tetramethylbiphenol epoxy resins, biphenylaralkyl epoxy resins, and novolac epoxy resins are preferably used particularly in view of excellent flame retardancy of a cured product.

With respect to the mixing amounts of the active ester resin (A) and the epoxy resin (B) in the thermosetting resin composition of the present invention, the ratio of carbonyloxy groups constituting ester in the active ester resin (A) is 0.8 to 1.5 equivalents per equivalent of epoxy groups in the epoxy resin (B) in view of good curability and good physical properties of a cured product. In particular, in view of the point that dielectric characteristics and heat resistance of a cured product can be improved while excellent flame retardancy is maintained, the ratio is preferably 1.1 to 1.3 equivalents.

The thermosetting resin composition of the present invention may use a curing agent for an epoxy resin in combination with the active ester resin (A) and the epoxy resin (B). Examples of the curing agent for an epoxy resin which can be used include curing agents such as amine compounds, amide compounds, acid anhydride compounds, phenol compounds, and the like. Examples of the amine compounds include diaminodiphenylmethane, diethylenetriamine, triethylenetetramine, diaminodiphenylsulfone, isophoronediamine, imidazole, $BF_3$-amine complexes, guanidine derivatives, and the like. Examples of the amide compounds include dicyandiamide, polyamide resin synthesized from linolenic acid dimer and ethylenediamine, and the like. Examples of the acid anhydride compounds include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, and the like. Examples of the phenol compounds include polyhydric phenol compounds such as phenol novolac resins, cresol novolac resins, aromatic hydrocarbon formaldehyde resin-modified phenol resins, dicyclopentadiene phenol addition-type resins, phenol aralkyl resins, naphthol aralkyl resins, trimethylolmethane resins, tetraphenylolethane resins, naphthol novolac resins, naphthol-phenol co-condensed novolac resins, naphthol-cresol co-condensed novolac resins, biphenyl-modified phenol resins (polyhydric phenol compounds having phenol nuclei connected through bismethylene groups), biphenyl-modified naphthol resins (polyhydric naphthol compounds having phenol nuclei connected through bismethylene groups), aminotriazine-modified phenol resins (polyhydric phenol compounds having phenol nuclei connected through melamine or benzoguanamine), and the like.

Among these, phenol compounds each having many aromatic skeletons in its molecular structure are preferred in view of the flame retardant effect. Specifically, phenol novolac resins, cresol novolac resins, aromatic hydrocarbon formaldehyde resin-modified phenol resins, phenol aralkyl resins, naphthol aralkyl resins, naphthol novolac resins, naphthol-phenol co-condensed novolac resins, naphthol-cresol co-condensed novolac resins, biphenyl-modified phenol resins, biphenyl-modified naphthol resins, and aminotriazine-modified phenol resins are preferred because of excellent flame retardancy.

When the curing agent for an epoxy resin is used, the amount of use is preferably in a range of 10 to 50% by mass in view of dielectric characteristics.

If required, a curing accelerator can also be combined in the thermosetting resin composition of the present invention. As the curing accelerator, various agents can be used, but examples thereof include phosphorus-based compounds, tertiary amines, imidazole, organic acid metal salts, Lewis acids, amine complex salts, and the like. In particular, in use for application to build-up materials and circuit boards, dimethylaminopyridine and imidazole are preferred in view of excellent heat resistance, dielectric characteristics, solder resistance, etc. In particular, in use for application to semiconductor encapsulating materials, triphenylphosphine as a phosphorus-based compound and 1,8-diazabicyclo-[5.4.0]-undecene (DBU) as a tertiary amine are preferred in view of excellent curability, heat resistance, electric characteristics, moisture-resistance reliability, etc.

The above-detailed thermosetting resin composition of the present invention is characterized by exhibiting excellent solvent solubility as described above. Therefore, the thermosetting resin composition preferably contains an organic solvent (C) in addition to the above-described components. Examples of the organic solvent (C) which can be used include methyl ethyl ketone, acetone, dimethylformamide, methyl isobutyl ketone, methoxypropanol, cyclohexanone, methyl cellosolve, ethyl diglycol acetate, propylene glycol monomethyl ether acetate, and the like. The selection and proper amount of the organic solvent (C) used can be appropriately determined according to applications. For example, in application to printed circuit boards, polar solvents having a boiling point of 160° C. or less, such as methyl ethyl ketone, acetone, 1-methoxy-2-propanol, and the like, are preferred, and they are preferably used so that the nonvolatile component ratio is 40 to 80% by mass. In addition, in application to adhesive films for build-up, preferred examples of the organic solvent (C) include ketones such as acetone, methyl ethyl ketone, cyclohexanone, and the like; acetate esters such as ethyl acetate, butyl acetate, cellosolve acetate, propylene glycol monomethyl ether acetate, carbitol acetate, and the like; carbitols such as cellosolve, butyl carbitol, and the like; aromatic hydrocarbons such as toluene, xylene, and the like; dimethylformamide; dimethylacetamide; N-methylpyrrolidone; and the like. These organic solvents are preferably used so that the nonvolatile component ratio is 30 to 60% by mass.

In addition, for example, in the field of printed circuit boards, in order to exhibit flame retardancy, a non-halogen flame retardant containing substantially no halogen atom may be mixed in the thermosetting resin composition in a range without deterioration in reliability.

Examples of the non-halogen flame retardant include a phosphorus-based flame retardant, a nitrogen-based flame retardant, a silicone-based flame retardant, an inorganic flame retardant, an organic metal salt-based flame retardant, and the like. Use of these flame retardants is not particularly limited, and they may be used alone or in combination of a plurality of flame retardants of the same type or different types.

As the phosphorus-based flame retardant, either an inorganic type or an organic type can be used. Examples of an inorganic compound include red phosphorus; ammonium phosphates such as monoammonium phosphate, diammonium phosphate, triammonium phosphate, ammonium polyphosphate, and the like; and inorganic nitrogen-containing phosphorus compounds such as phosphoric amide, and the like.

The red phosphorus is preferably surface-treated for preventing hydrolysis or the like. Examples of a surface treatment method include (i) a method of coating with an inorganic compound such as magnesium hydroxide, aluminum hydroxide, zinc hydroxide, titanium hydroxide, bismuth oxide, bismuth hydroxide, bismuth nitrate, or a mixture thereof, (ii) a method of coating with a mixture of an inorganic compound, such as magnesium hydroxide, aluminum hydroxide, zinc hydroxide, or titanium hydroxide, and a thermosetting resin, such as a phenol resin, (iii) a doubly coating method of coating with a film of an inorganic compound such as magnesium hydroxide, aluminum hydroxide, zinc hydroxide, or titanium hydroxide, and coating the film with a thermosetting resin such as a phenol resin, and the like.

Examples of the organic phosphorus compound include general-purpose organic phosphorus compounds such as phosphate compounds, phosphonic acid compounds, phosphinic acid compounds, phosphine oxide compounds, phospholan compounds, organic nitrogen-containing phosphorus compounds, and the like; cyclic organic phosphorus compounds such as 9,10-dihydro-9-oxa-10-phosphaphenanthrene=10-oxide, 10-(2,5-dihydroxyphenyl)-10H-9-oxa-10-phosphaphenanthrene=10-oxide, 10-(2,7-dihydroxynaphthyl)-10H-9-oxa-10-phosphaphenanthrene-10-oxide, and the like; and derivatives produced by reaction of the phosphorus compounds with a compound such as an epoxy resin, a phenol resin, or the like.

The mixing amount is appropriately selected according to the type of the phosphorus-based flame retardant, the other components of the thermosetting resin composition, and the desired degree of flame retardancy. For example, when red phosphorus is used as the non-halogen flame retardant, the flame retardant is preferably mixed in a rage of 0.1 to 2.0 parts by mass in 100 parts by mass of the thermosetting resin composition containing all of the active ester resin (A), the epoxy resin (B), the non-halogen flame retardant, filler, and the other additives. Similarly, when the organic phosphorus compound is used, it is preferably mixed in a range of 0.1 to 10.0 parts by mass, particularly preferably in a range of 0.5 to 6.0 parts by mass.

When the phosphorus-based flame retardant is used, the phosphorus-based flame retardant may be combined with hydrotalcite, magnesium hydroxide, a boron compound, zirconium oxide, a black dye, calcium carbonate, zeolite, zinc molybdate, activated carbon, or the like.

Examples of the nitrogen-based flame retardant include triazine compounds, cyanuric acid compounds, isocyanuric acid compounds, phenothiazine, and the like, and the triazine compounds, the cyanuric acid compounds, and the isocyanuric acid compounds are preferred.

Examples of the triazine compounds include melamine, acetoguanamine, benzoguanamine, melon, melam, succinoguanamine, ethylenedimelamine, melamine polyphosphate, triguanamine, and other compounds such as aminotriazine sulfate compounds such as guanylmelamine sulfate, melem sulfate, melam sulfate, and the like; phenol resins modified with the aminotriazine, and phenol resins modified with the aminotriazine and further modified with tung oil, isomerized linseed oil, or the like; and the like.

Examples of the cyanuric acid compounds include cyanuric acid, melamine cyanurate, and the like.

The amount of the nitrogen-based flame retardant mixed is appropriately selected according to the type of the nitrogen-based flame retardant, the other components of the thermosetting resin composition, and the desired degree of flame retardancy. For example, the nitrogen-based flame retardant is preferably mixed in a range of 0.05 to 10 parts by mass, particularly preferably in a range of 0.1 to 5 parts by mass, in 100 parts by mass of the thermosetting resin composition containing all of the active ester resin (A), the epoxy resin (B), the non-halogen flame retardant, filler, and the other additives.

In addition, the nitrogen-based flame retardant may be used in combination with a metal hydroxide, a molybdenum compound, or the like.

The silicone-based flame retardant is not particularly limited and any silicone-based flame retardant can be used as long as it is an organic compound containing a silicon atom. Examples thereof include silicone oil, silicone rubber, silicone resins, and the like.

The amount of the silicone-based flame retardant mixed is appropriately selected according to the type of the silicone-based flame retardant, the other components of the thermosetting resin composition, and the desired degree of flame retardancy. For example, the silicone-based flame retardant is preferably mixed in a range of 0.05 to 20 parts by mass in 100 parts by mass of the thermosetting resin composition containing all of the active ester resin (A), the epoxy resin (B), the non-halogen flame retardant, filler, and the other additives. In addition, the silicone-based flame retardant may be used in combination with a molybdenum compound, alumina, or the like.

Examples of the inorganic flame retardant include metal hydroxides, metal oxides, metal carbonate compounds, metal powders, boron compounds, low-melting-point glass, and the like.

Examples of the metal hydroxides include aluminum hydroxide, magnesium hydroxide, dolomite, hydrotalcite, calcium hydroxide, barium hydroxide, zirconium hydroxide, and the like.

Examples of the metal oxides include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, tungsten oxide, and the like.

Examples of the metal carbonate compounds include zinc carbonate, magnesium carbonate, calcium carbonate, barium carbonate, basic magnesium carbonate, aluminum carbonate, iron carbonate, cobalt carbonate, titanium carbonate, and the like.

Examples of the metal powders include powders of aluminum, iron, titanium, manganese, zinc, molybdenum, cobalt, bismuth, chromium, nickel, copper, tungsten, tin, and the like.

Examples of the boron compounds include zinc borate, zinc metaborate, barium metaborate, boric acid, borax, and the like.

Examples of the low-melting-point glass include Seaplea (Bokusui Brown Co., Ltd.), hydrated glass $SiO_2$—MgO—$H_2O$, and PbO—$B_2O_3$-based, ZnO—$P_2O_5$—MgO-based, $P_2O_5$—$B_2O_3$—PbO—MgO-based, P—Sn—O—F-based, PbO—$V_2O_5$—$TeO_2$-based, $Al_2O_3$—$H_2O$-based, and lead borosilicate-based glass compounds.

The amount of the inorganic flame retardant mixed is appropriately selected according to the type of the inorganic flame retardant, the other components of the thermosetting resin composition, and the desired degree of flame retardancy. For example, the inorganic flame retardant is preferably mixed in a range of 0.05 to 20 parts by mass, particularly preferably in a range of 0.5 to 15 parts by mass, in 100 parts by mass of the thermosetting resin composition containing all of the active ester resin (A), the epoxy resin (B), the non-halogen flame retardant, filler, and the other additives.

Examples of the organic metal salt-based flame retardant include ferrocene, acetylacetonate metal complexes, organic metal carbonyl compounds, organic cobalt salt compounds, organic sulfonic acid metal salts, compounds each having an ionic bond or coordinate bond between a metal atom and an aromatic compound or heterocyclic compound, and the like.

The amount of the organic metal salt-based flame retardant mixed is appropriately selected according to the type of the organic metal salt-based flame retardant, the other components of the thermosetting resin composition, and the desired degree of flame retardancy. For example, the organic metal salt-based flame retardant is preferably mixed in a range of 0.005 to 10 parts by mass in 100 parts by mass of the thermosetting resin composition containing all of the active ester resin (A), the epoxy resin (B), the non-halogen flame retardant, filler, and the other additives.

If required, an inorganic filler can be mixed in the thermosetting resin composition of the present invention. Examples of the inorganic filler include fused silica, crystalline silica, alumina, silicon nitride, aluminum hydroxide, and the like. When the amount of the inorganic filler mixed is particularly increased, the fused silica is preferably used. Although either crushed or spherical fused silica can be used, the spherical fused silica is preferably mainly used for increasing the amount of the fused silica mixed and suppressing an increase in melt viscosity of a molding material. In order to further increase the amount of the spherical silica mixed, the grain size distribution of the spherical silica is preferably properly adjusted. The filling rate is preferably as high as possible in view of flame retardancy, and particularly preferably 20% by mass or more of the whole amount of the thermosetting resin composition. In use for an application such as a conductive paste, conductive filler such as a silver powder, a copper powder, or the like can be used.

If required, various compounding agents such as a silane coupling agent, a mold release agent, a pigment, an emulsifier, etc. can be added to the thermosetting resin composition of the present invention.

The thermosetting resin composition of the present invention can be produced by uniformly mixing the above-described components. The thermosetting resin composition of the present invention containing the active ester resin (A) and the epoxy resin (B) and, if required, further containing the curing accelerator can be easily formed into a cured product by the same method as a general known method. Examples of the cured product include molded cured products such as a laminate, a cast product, an adhesive layer, a coating film, a film, and the like.

Applications using the thermosetting resin composition of the present invention include hard printed circuit board materials, resin compositions for flexible circuit boards, insulating materials for circuit boards such as interlayer insulating materials for build-up substrates, semiconductor encapsulating materials, conductive paste, adhesive films for build-up, resin casing materials, adhesives, and the like. Among these various applications, in application to hard printed circuit board materials, insulating materials for electronic circuit boards, and adhesive films for build-up, the thermosetting resin composition can be used as an insulating material for so-called substrates with built-in electronic components in which a passive component such as a capacitor and an active component such as an IC chip are embedded in a substrate. In particular, in view of the characteristics such as high flame retardancy, high heat resistance, low thermal expansibility, and solvent solubility, the thermosetting resin composition is preferably used for hard printed circuit board materials, resin compositions for flexible circuit boards, insulating materials for circuit boards such as interlayer insulating materials for build-up substrates, and semiconductor encapsulating materials.

A circuit board according to the present invention is produced by diluting the thermosetting resin composition with an organic solvent to prepare a varnish, forming the varnish into a plate shape, laminating the plate with a copper foil, and then pressing them under heating. Specifically, for example, a method for producing a hard printed circuit board includes further mixing an organic solvent with the varnish-like thermosetting resin composition containing the organic solvent to prepare a varnish, impregnating a reinforcement substrate with the varnish, semi-curing the substrate to prepare a prepreg according to the present invention, and them laminating a copper foil on the prepreg, followed by thermocompression bonding. Examples of the reinforcement substrate include paper, a glass cloth, a glass nonwoven fabric, aramid paper, an aramid cloth, a glass mat, a glass roving cloth, and the like. In detail, in this method, first, the varnish-like thermosetting resin composition is heated to a heating temperature according to the solvent type used, preferably 50 to 170° C., to form a prepreg as a cured product. The mass ratio between the thermosetting resin composition and the reinforcement substrate used is not particularly limited but is preferably adjusted so that the resin content in the prepreg is 20 to 60% by mass. Then, the prepregs formed as described above are stacked by a usual method, and a copper foil is appropriately laminated thereon and heat-pressure bonded at 170 to 250° C. for 10 minutes to 3 hours under a pressure of 1 to 10 MPa, thereby producing the intended circuit board.

In order to produce a flexible circuit board using the thermosetting resin composition of the present invention, the active ester resin (A), the epoxy resin (B), and the organic solvent are mixed, and the resultant mixture is applied to an electrically insulating film with a coater such as a reverse coater, a comma coater, or the like. Then, the film is heated at 60° C. to 170° C. for 1 to 15 minutes using a heater to evaporate the solvent and bring an adhesive composition into a B-stage. Next, a metal foil is thermo-compression bonded to the adhesive using a heating roll or the like. During this boding, preferably the compression-bonding pressure is 2 to 20 N/cm, and the compression-bonding temperature is 40° C. to 200° C. When sufficient bonding performance is obtained, the compression bonding may be finished, but when complete curing is required, post-curing is preferably further performed under conditions of 100° C. to 200° C. and 1 to 24 hours. The thickness of an adhesive composition film after final curing is preferably in a range of 5 to 100 μm.

As a method for producing an interlayer insulating material for a build-up substrate using the thermosetting resin composition of the present invention, for example, the thermosetting resin composition appropriately containing rubber and filler is applied to a circuit board having a circuit formed thereon by a spray coating method, a curtain coating method, or the like, and then cured. Then, if required, predetermined through holes are formed, and then a surface is treated with a coarsening agent, washed with hot water to form projections and depressions, and then plated with a metal such as copper. As the plating method, electroless plating and electrolytic plating are preferred, and an oxidizer, an alkali, and an organic solvent can be used as the coarsening agent. Such an operation is successively repeated according to demand to alternately build up a resin insulating layer and a conductor layer of a predetermined circuit pattern, thereby producing a build-up substrate. However, the through holes are formed after the outermost resin insulating layer is formed. Also, a build-up substrate can be formed by pressure-bonding a copper foil with a resin, which is formed by semi-curing the resin composition on the copper foil, under heating at 170 to 250° C. on the circuit board having a circuit formed thereon, without the steps of forming a coarsened surface and of plating.

As a method for producing a semiconductor encapsulating material from the thermosetting resin composition of the present invention, the compounding agents such as the active ester resin (A), the epoxy resin (B), an inorganic filler etc. are sufficiently melt-mixed until the resultant mixture becomes uniform using an extruder, a kneader, a roll, or the like according to demand. In this case, silica is generally used as the inorganic filler, and in order to produce the semiconductor encapsulating material of the present invention, the inorganic filler is mixed at a ratio of 70% to 95% by mass in the thermosetting resin composition. In order to mold a semiconductor package, there is a method in which the composition is molded by casting or using a transfer molding machine or injection molding machine and then heated at 50 to 200° C. for 2 to 10 hours, thereby producing a semiconductor device as a molded product.

A method for producing an adhesive film for build up from the thermosetting resin composition of the present invention is, for example, a method of applying the thermosetting resin composition of the present invention on a support film to form a resin composition layer, thereby forming an adhesive film for a multilayer printed circuit board.

When the thermosetting resin composition of the present invention is used for an adhesive film for build up, it is important for the adhesive film to soften at a lamination temperature condition (usually 70° C. to 140° C.) in a vacuum lamination method and to exhibit fluidity (resin flow) which permits resin filling in via holes or through holes present in the circuit board at the same time as lamination on the circuit board. Therefore, the above-described components are preferably mixed so as to exhibit these characteristics.

The through holes in the multilayer printed circuit board generally have a diameter of 0.1 to 0.5 mm and a depth of 0.1 to 1.2 mm, and can be filled with the resin within this range. When both surfaces of the circuit board are laminated, the through holes are preferably about ½ filled.

Specifically, the method for producing the adhesive film includes preparing the varnish-like thermosetting resin composition of the present invention, applying the varnish-like composition on a surface of a support film, and further drying the organic solvent by heating or hot air spraying to form a thermosetting resin composition layer (α).

The thickness of the layer (α) formed is generally not less than the thickness of the conductor layer. Since the thickness of the conductor layer provided in the circuit board is generally in the range of 5 to 70 μm, the thickness of the resin composition layer is preferably 10 to 100 μm.

The layer (α) may be protected by a protecting film described below. Protecting by the protecting film can prevent adhesion of dust to the surface of the resin composition layer and scratches thereon.

Examples of the support film and the protecting film include films of polyolefins such as polyethylene, polypropylene, polyvinyl chloride, and the like, polyesters such as polyethylene terephthalate (may be abbreviated as "PET" hereinafter), polyethylene naphthalate, and the like, polycarbonate, polyimide, release paper, and metal foils such as a copper foil, an aluminum foil, and the like. The support film and the protecting film may be subjected to MAD treatment, corona treatment, or release treatment.

The thickness of the support film is not particularly limited, but is generally 10 to 150 μm and preferably in a range of 25 to 50 μm. The thickness of the protecting film is preferably 1 to 40 μm.

The support film is separated after being laminated on the circuit board or after the insulating film is formed by heat curing. When the support film is separated after the adhesive film is heat-cured, adhesion of dust in the curing step can be prevented. When the support film is separated after curing, generally, the support film is previously subjected to release treatment.

Next, in the method for producing the multilayer printed circuit board using the adhesive film formed as described above, for example, when the layer (α) is protected by the protecting film, the protecting film is separated, and then the layer (α) is laminated on one or both surfaces of the circuit board by, for example, a vacuum lamination method so that the layer is in direct contact with the circuit board. The lamination method may be a butch mode or a continuous mode using a roll. In addition, if required, the adhesive film and the circuit board may be heated (preheated) before the lamination.

The lamination is preferably performed under the lamination conditions including a pressure-bonding temperature (lamination temperature) of 70° C. to 140° C. and a pressure-bonding pressure of 1 to 11 kgf/cm$^2$ ($9.8 \times 10^4$ to $107.9 \times 10^4$ N/m$^2$), and under reduced air pressure of 20 mmHg (26.7 hPa) or less.

When the thermosetting resin composition of the present invention is used as conductive paste, examples of a usable method include a method of preparing a composition for an anisotropic conductive film by dispersing conductive fine particles in the thermosetting resin composition, and a method of preparing a circuit-connecting paste resin composition or an anisotropic conductive adhesive which is liquid at room temperature.

In addition, the thermosetting resin composition of the present invention can be used as a resist ink. In this case, as a usable method, a resist ink composition is prepared by adding, to the thermosetting resin composition, a vinyl monomer having an ethylenically unsaturated double bond and a cationic polymerization catalyst serving as a curing agent and further a pigment, talc, and filler, applied on a printed board by a screen printing method, and then cured to form a resist ink cured product.

As a method for producing a cured product of the present invention, for example, the composition prepared by the above-described method may be heated in a temperature range of about 20° C. to about 250° C.

Therefore, according to the present invention, a thermosetting resin composition exhibiting a high degree of flame retardancy and excellent environmental friendliness can be produced without using a halogen-based flame retardant. In addition, excellent dielectric characteristics of a cured product of the resin permit the realization of higher operation speeds in high-frequency devices. Further, the phenolic hydroxyl group-containing resin can be easily produced with high efficiency by the production method according to the present invention, and molecular design can be made according to the above-described intended performance level.

EXAMPLES

Next, the present invention is described in further detail with reference to examples and comparative examples, and "parts" and "%" below are on a mass basis unless otherwise specified. In addition, melt viscosity at 150° C., a softening point, GPC, and $^{13}$C-NMR, and FD-MS spectra were measured under conditions described below.

1) Melt viscosity at 150° C.: according to ASTM D4287
2) Softening point measuring method: according to JIS K7234
3) GPC: measured with measurement apparatus: "HLC-8220 GPC" manufactured by Tosoh Corporation under the following conditions.
Column: TSK-GEL G2000HXL G2000HXL G3000HXL+G4000HXL manufactured by Tosoh Corporation
Solvent: tetrahydrofuran
Flow rate: 1 ml/min
Detector: RI
4) $^{13}$C-NMR: measured with "NMR GSX270" manufactured by JEOL, Ltd.
5) FD-MS: measured with double focusing mass spectrometer "AX505H (FD505H)" manufactured by JEOL, Ltd.

Synthesis Example 1

In a flask provided with a thermometer, a dropping funnel, a cooling tube, a fractionating column, and a stirrer, 160 g (1.0 mole) of 2,7-dihydroxynaphthalene, 25 g (0.25 moles) of benzyl alcohol, 160 g of xylene, and 2 g of paratoluenesulfonic acid monohydrate were charged, and the resultant mixture was stirred at room temperature under nitrogen blowing. Then, the mixture was heated to 140° C. and stirred for 4 hours while the produced water was distilled off to the outside of the system (xylene distilled off at the same time was returned into the system). Then, the mixture was heated to 150° C. and stirred for 3 hours while the produced water and xylene were distilled off to the outside of the system. After the completion of reaction, the reaction solution was neutralized by adding 2 g of a 20% aqueous sodium hydroxide solution, and then water and xylene were removed under reduced pressure to produce 178 g of phenolic hydroxyl group-containing resin (A-1). The resultant phenolic hydroxyl group-containing resin (A-1) was a blown solid and had a hydroxyl equivalent of 178 g/eq. and a softening point of 130° C. FIG. 1 shows a GPC chart of the resultant phenolic hydroxyl group-containing resin (A-1).

Figure 2:
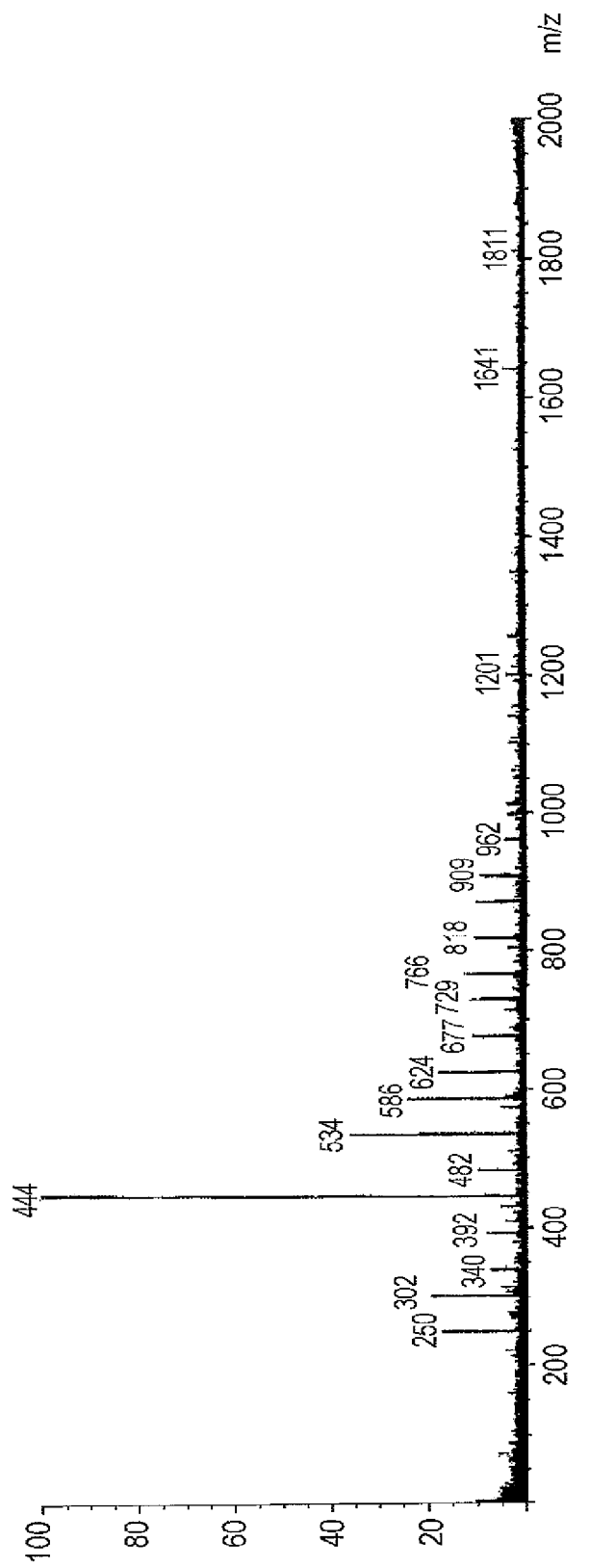
FIG. 2 is a FD-MS spectrum of phenolic hydroxyl group-containing resin (A-1) produced in Synthesis Example 1.
Figure 3:
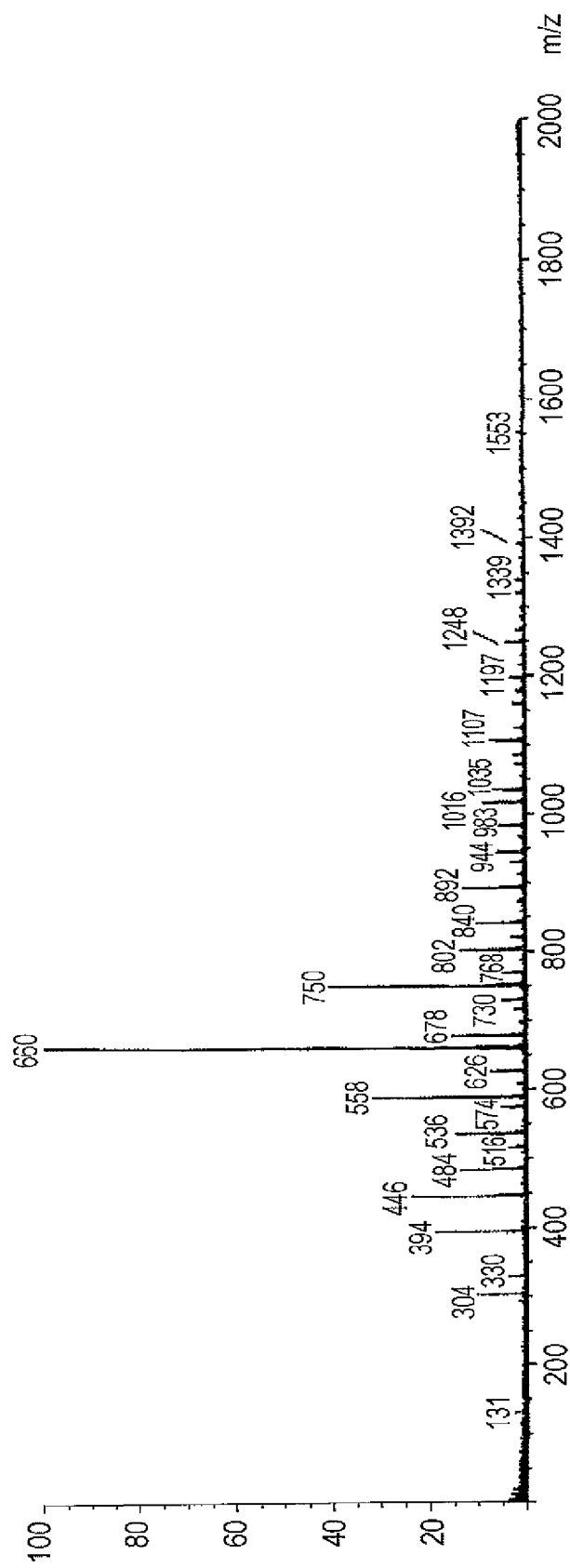
FIG. 3 is a FD-MS spectrum obtained by a trimethylsilylation method for phenolic hydroxyl group-containing resin (A-1) produced in Synthesis Example 1.

The phenolic hydroxyl group-containing resin (A-1) was subjected to structural analysis by MS (FIG. 2) and $^{13}$C-NMR, and further the phenolic hydroxyl group-containing resin (A-1) was trimethylsilylated to be used in MS measurement by a trimethylsilylation method (FIG. 3). Then, peaks a to f below were confirmed by MS.

a. A peak (M$^+$=250) of 2,7-dihydroxynaphthalene (Mw: 160) with a benzyl group (molecular weight Mw: 90) added and a peak (M$^+$=340) of 2,7-dihydroxynaphthalene (Mw: 160) with two benzyl groups (molecular weight Mw: 90) added.

Therefore, the peaks a were confirmed to be due to a compound with a structure produced by bonding 1 mole of benzyl group to 1 mole of 2,7-dihydroxynaphthalene and a compound with a structure produced by bonding 2 moles of benzyl groups to 1 mole of 2,7-dihydroxynaphthalene.

b. A peak (M$^+$=302) of 2,7-dihydroxynaphthalene dimer and a peak (M$^+$=446) of 2,7-dihydroxynaphthalene dimer with two trimethylsilyl groups (molecular weight Mw: 72) added.

Therefore, the peaks b were confirmed to be due to 2,7-dihydroxynaphthalene dimer ether compound.

c. A peak (M$^+$=444) of 2,7-dihydroxynaphthalene trimer, a peak (M$^+$=588) of 2,7-dihydroxynaphthalene trimer with two trimethylsilyl groups (molecular weight Mw: 72) added, and a peak (M$^+$=660) of 2,7-dihydroxynaphthalene trimer with three trimethylsilyl groups added.

Therefore, the peaks c were confirmed to be due to 2,7-dihydroxynaphthalene trimer ether compound and a trimer compound having a structure produced by nuclear dehydration of 1 mole of 2,7-dihydroxynaphthalene to 1 mole of 2,7-dihydroxynaphthalene dimer ether.

d. A peak (M$^+$=586) of 2,7-dihydroxynaphthalene tetramer, a peak (M$^+$=730) of 2,7-dihydroxynaphthalene tetramer with two trimethylsilyl groups (molecular weight Mw: 72) added, and a peak (M$^+$=802) of 2,7-dihydroxynaphthalene tetramer with three trimethylsilyl groups added.

Therefore, the peaks d were confirmed to be due to 2,7-dihydroxynaphthalene tetramer ether compound and a tetramer compound having a structure produced by nuclear dehydration of 1 mole of 2,7-dihydroxynaphthalene to 1 mole of 2,7-dihydroxynaphthalene trimer ether.

e. A peak (M$^+$=729) of 2,7-dihydroxynaphthalene pentamer, a peak (M$^+$=873) of 2,7-dihydroxynaphthalene pentamer with two trimethylsilyl groups (molecular weight Mw: 72) added, a peak (M$^+$=944) of 2,7-dihydroxynaphthalene pentamer with three trimethylsilyl groups added, and a peak (M$^+$=1016) of 2,7-dihydroxynaphthalene pentamer with four trimethylsilyl groups added.

Therefore, the peaks e were confirmed to be due to 2,7-dihydroxynaphthalene pentamer ether compound, a pentamer compound having a structure produced by nuclear dehydration of 1 mole of 2,7-dihydroxynaphthalene to 1 mole of 2,7-dihydroxynaphthalene tetramer ether, and a pentamer compound having a structure produced by nuclear dehydration of 2 moles of 2,7-dihydroxynaphthalene to 1 mole of 2,7-dihydroxynaphthalene trimer ether.

f. A peak of each of b to e with one benzyl group (molecular weight Mw: 90) added, and a peak of each of b to e with two benzyl groups (molecular weight Mw: 90) added. Therefore, the peaks were confirmed to be due to a compound having a structure produced by bonding 1 mole of benzyl group to each of b to e and a compound having a structure produced by bonding 0.2 moles of benzyl groups to each of b to e.

Synthesis Example 2

According to the same reaction as in Synthesis Example 1 except that the reaction was performed at a temperature of 150° C. for 3 hours, the amount of benzyl alcohol used was changed to 108 g (1.0 mole), and 160 g of xylene was not added, 240 g of phenolic hydroxyl group-containing resin (A-2) was produced. The resultant phenolic hydroxyl group-containing resin (A-2) was a blown solid and had a hydroxyl equivalent of 160 g/eq. and a softening point of 77° C.

Synthesis Example 3

In a flask provided with a thermometer, a dropping funnel, a cooling tube, a fractionating column, and a stirrer, 178 g of the phenolic hydroxyl group-containing resin (A-1) and 816 g of methyl isobutyl ketone (hereinafter abbreviated as "MIBK") were charged to prepare a solution under reduced pressure in a system purged with nitrogen. Then, 126.5 g (0.90 moles) of benzyl chloride was charged, and 189.0 g of a 20% aqueous sodium hydroxide solution was added dropwise over 3 hours under nitrogen gas purging while the inside of the system was controlled to 60° C. or less. Next, the mixture was stirred under the same conditions for 1.0 hour. After the completion of reaction, an aqueous layer was removed by standing liquid-liquid separation. Further, water was poured into a MIBK phase in which the reaction product was dissolved and then mixed under stirring for about 15 minutes, followed by standing liquid-liquid separation to remove an aqueous layer. This operation was repeated until the aqueous layer became pH 7. Then, water was removed by dehydration with a decanter, and then MIBK was removed by reduced-pressure dehydration to produce active ester resin (B-1). The active ester resin (B-1) had a functional group equivalent of 272 g/eq. determined from the charging ratio and a softening point of 125° C. In addition, the esterification rate of phenolic hydroxyl groups was 90%. In a MS spectrum, peaks of compounds produced by reaction of the compounds contained in the phenolic hydroxyl group-containing resin (A-1) with benzyl chloride accompanied by dehydrochlorination were confirmed in the active ester resin. The formation of carbonyl carbons derived from ester groups was confirmed by a peak at 165 ppm in $^{13}$C-NMR.

Synthesis Example 4

According to the same reaction as in Synthesis Example 3 except that 70.3 g (0.50 moles) of benzoyl chloride was used, active ester resin (B-2) was produced. The resultant active ester resin (B-2) had a functional group equivalent of 230 g/eq. determined by the charging ratio and a softening point of 128° C.

Example 1

Figure 4:
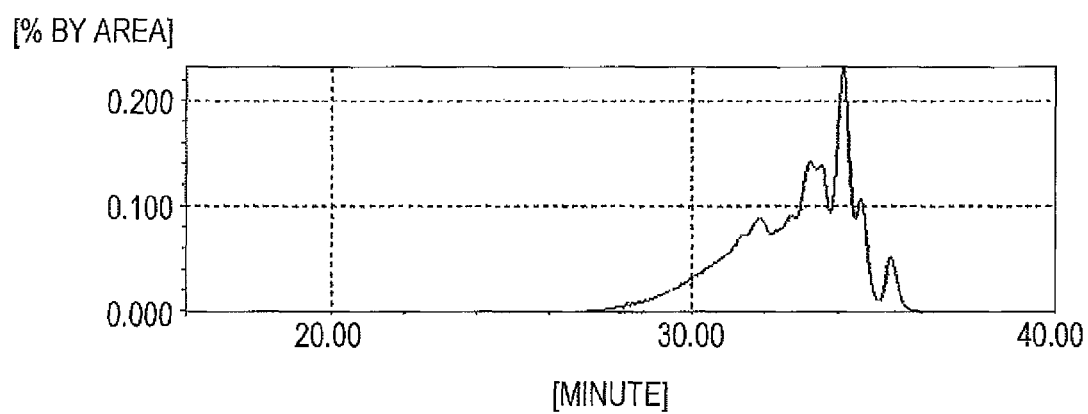
FIG. 4 is a GPC chart of active ester resin (B-3) produced in Example 1.
Figure 5:
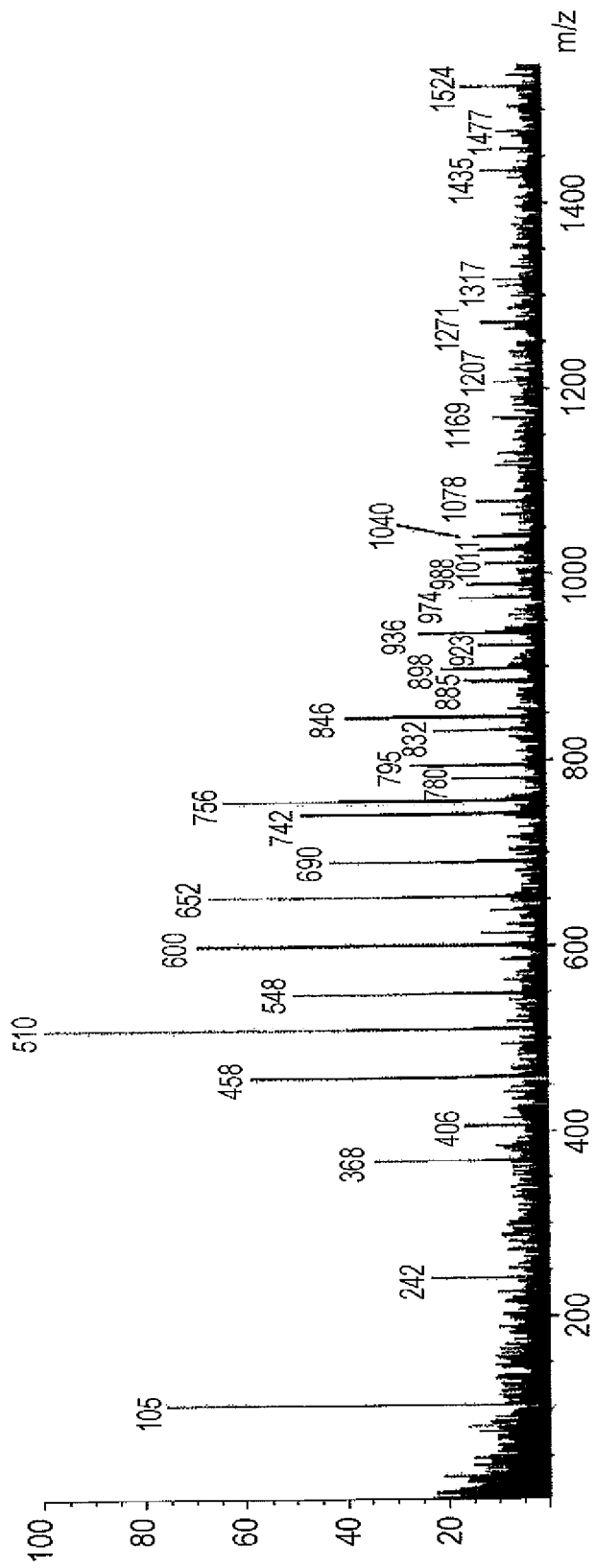
FIG. 5 is a FD-MS spectrum of active ester resin (B-3) produced in Example 1.
Figure 6:
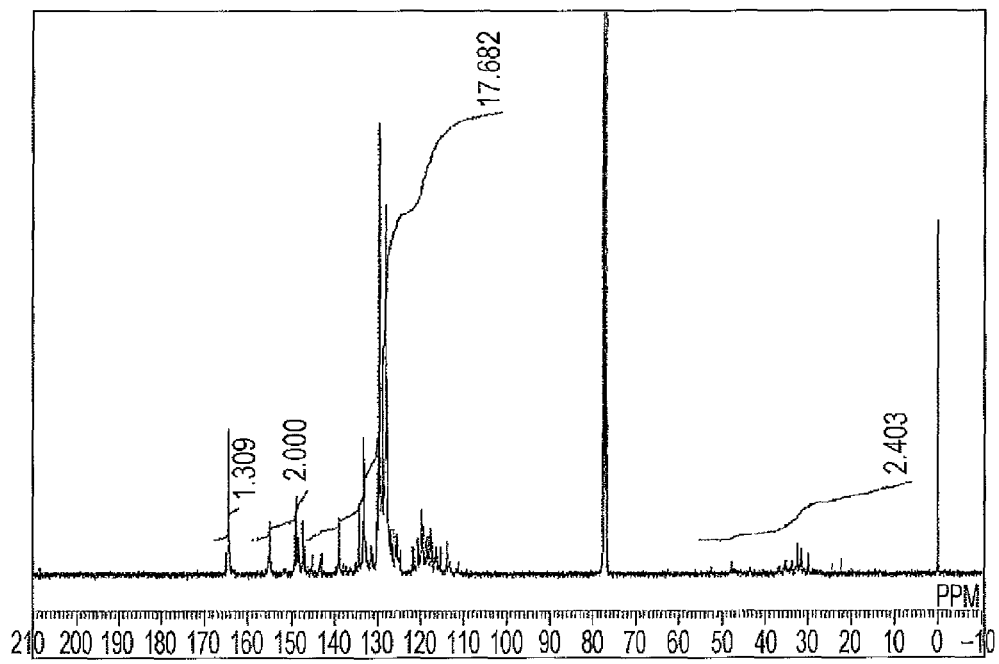
FIG. 6 is a $^{13}$C-NMR chart of active ester resin (B-3) produced in Example 1.

In a flask provided with a thermometer, a dropping funnel, a cooling tube, a fractionating column, and a stirrer, 272 g of the active ester resin (B-1) and 816 g of methyl isobutyl ketone (hereinafter abbreviated as "MIBK") were charged to prepare a solution under reduced pressure in a system purged with nitrogen. Then, 10.1 g (0.05 moles) of isophthalic chloride was charged, and 21 g of a 20% aqueous sodium hydroxide solution was added dropwise over 3 hours under nitrogen gas purging while the inside of the system was controlled to 60° C. or less. Next, the mixture was stirred under the same conditions for 1.0 hour. After the completion of reaction, an aqueous layer was removed by standing liquid-liquid separation. Further, water was poured into a MIBK phase in which the reaction product was dissolved and then mixed under stirring for about 15 minutes, followed by standing liquid-liquid separation to remove an aqueous layer. This operation was repeated until the aqueous layer became pH 7. Then, water was removed by dehydration with a decanter, and then MIBK was removed by reduced-pressure dehydration to produce active ester resin (B-3). The active ester resin (B-3) had a functional group equivalent of 278 g/eq. determined from the charging ratio and a softening point of 135° C. In addition, the esterification rate of phenolic hydroxyl groups was 100%. FIG. 4 shows a GPC chart of the resultant active ester resin. In a MS spectrum (FIG. 5), peaks of compounds produced by reaction of the compounds contained in the active ester resin (B-1) with isophthalic chloride accompanied by dehydrochlorination were confirmed in the active ester resin (B-3). The formation of carbonyl carbons derived from ester groups was confirmed by a peak at 165 ppm in $^{13}$C-NMR (FIG. 6).

Example 2

According to the same reaction as in Example 1 except that 230 of the active ester resin (B-2) and 50.5 g (0.25 moles) of isophthalic chloride were used, active ester resin (B-4) was produced. The resultant active ester resin (B-4) had a functional group equivalent of 262 g/eq. determined by the charging ratio and a softening point of 175° C.

Example 3

In a flask provided with a thermometer, a dropping funnel, a cooling tube, a fractionating column, and a stirrer, 160 g of the phenolic hydroxyl group-containing resin (A-2) produced in Synthesis Example 2 and 480 g of methyl isobutyl ketone (hereinafter abbreviated as "MIBK") were charged to prepare a solution under reduced pressure in a system purged with nitrogen. Then, 69.0 g (0.34 moles) of isophthalic chloride and 46.4 g (0.33 moles) of benzyl chloride were charged, and 210 g of a 20% aqueous sodium hydroxide solution was added dropwise over 3 hours under nitrogen gas purging while the inside of the system was controlled to 60° C. or less. Next, the mixture was stirred under the same conditions for 1.0 hour. After the completion of reaction, an aqueous layer was removed by standing liquid-liquid separation. Further, water was poured into a MIBK phase in which the reaction product was dissolved and then mixed under stirring for about 15 minutes, followed by standing liquid-liquid separation to remove an aqueous layer. This operation was repeated until the aqueous layer became pH 7. Then, water was removed by dehydration with a decanter, and then MIBK was removed by reduced-pressure dehydration to produce active ester resin (B-5). The active ester resin (B-5) had a functional group equivalent of 238 g/eq. determined from the charging ratio and a softening point of 189° C. In addition, the esterification rate of phenolic hydroxyl groups was 100%. In a MS spectrum, peaks of compounds produced by reaction of the compounds contained in the phenolic hydroxyl group-containing resin (A-2 and with benzoyl chloride and isophthalic chloride accompanied by dehydrochlorination were confirmed in the active ester resin (B-5).

Example 4

Figure 7:
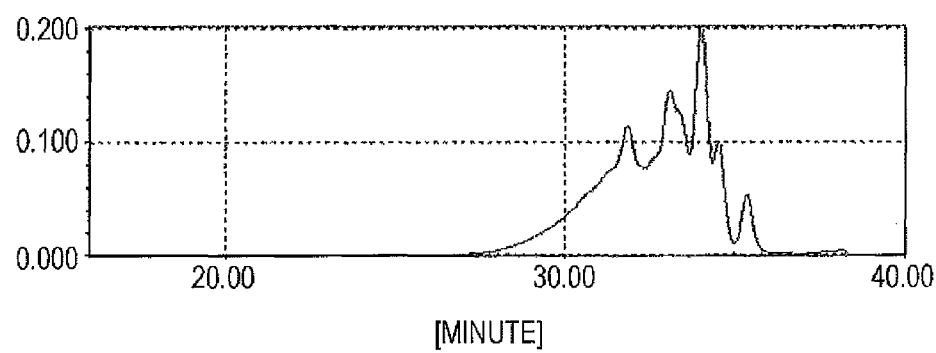
FIG. 7 is a GPC chart of active ester resin (B-6) produced in Example 4.

In a flask provided with a thermometer, a dropping funnel, a cooling tube, a fractionating column, and a stirrer, 178 g of the phenol resin (A-1) and 816 g of methyl isobutyl ketone (hereinafter abbreviated as "MIBK") were charged to prepare a solution under reduced pressure in a system purged with nitrogen. Then, 126.5 g (0.90 moles) of benzoyl chloride and 10.1 g (0.05 moles) of isophthalic chloride were charged, and 210.0 g of a 20% aqueous sodium hydroxide solution was added dropwise over 3 hours under nitrogen gas purging while the inside of the system was controlled to 60° C. or less. Next, the mixture was stirred under the same conditions for 1.0 hour. After the completion of reaction, an aqueous layer was removed by standing liquid-liquid separation. Further, water was poured into a MIBK phase in which the reaction product was dissolved and then mixed under stirring for about 15 minutes, followed by standing liquid-liquid separation to remove an aqueous layer. This operation was repeated until the aqueous layer became pH 7. Then, water was removed by dehydration with a decanter, and then MIBK was removed by reduced-pressure dehydration to produce active ester resin (B-6). The active ester resin (B-6) had a functional group equivalent of 272 g/eq. determined from the charging ratio and a softening point of 130° C. In addition, the esterification rate of phenolic hydroxyl groups was 100%. FIG. 7 shows a GPC chart of the resultant active ester resin.

Comparative Example 1

According to the same reaction (use) (using 126.5 g (0.90 moles) of benzoyl chloride) as in Synthesis Example 3 except that the phenolic hydroxyl group-containing resin (A-1) was changed to 105 g of phenol novolac resin ("Phenolite TD-2090" manufactured by DIC Corporation, hydroxyl equivalent 105 g/eq., softening point 120° C.), 188 g of active ester resin (B-7) was produced. The resultant active ester resin (B-7) had a functional group equivalent of 199 g/eq. determined by the charging ratio.

Examples 5 to 8 and Comparative Examples 2 to 4

Preparation Of Thermosetting Resin Composition and Evaluation of Physical Properties According to compositions shown in Table 1 below, phenol novolac epoxy resin ("N-770" manufactured by BIC Corporation, epoxy equivalent: 183 g/eq) used as an epoxy resin and each of (B-3) to (B-7) used as a curing agent were mixed, and 0.5 phr of dimethylaminopyridine was further added as a curing catalyst, and methyl ethyl ketone was mixed so that the nonvolatile content (N. V.) of each of the final compositions was 58% by mass.

Next, a laminated plate was formed on an experimental basis by curing under conditions described below and evaluated with respect to heat resistance, dielectric characteristics, and flame retardancy by methods below. The results are shown in Table 1.

<Conditions for Forming Laminated Plate>
Substrate: Glass Cloth "#2116" (210×280 mm) manufactured by Nitto Boseki Co., Ltd.
Number of plies: 6 Prepregnating condition: 160° C.
Curing conditions: 1.5 hours at 200° C. and 40 kg/cm$^2$
Thickness after molding: 0.8 mm <Heat Resistance (Glass Transition Temperature)>
A temperature with the maximum change in elastic modulus (maximum rate of change in tan δ) was evaluated as a glass transition temperature using a viscoelasticity measuring apparatus (DMA: solid viscoelasticity measuring apparatus RSAII manufactured by Rheometric Scientific Inc., rectangular tension method; frequency 1 Hz, heating rate 3° C./min).

<Measurement of Dielectric Constant and Dielectric Loss Tangent>
According to JIS-C-6481, a dielectric constant and dielectric loss tangent at 1 GHz were measured with impedance material analyzer "HP4291B" manufactured by Agilent Technologies Ltd. using a test piece after absolute drying and subsequent storage in a room at 23° C. and humidity 50% for 24 hours.

<Flame Retardancy>
A combustion test was conducted using five test pieces of 0.8 mm in thickness according to the UL-94 test method.

TABLE 1

| | | Example 5 | Example 6 | Example 7 | Example 8 | Example 9 | Example 10 | Comparative Example 2 | Comparative Example 3 | Comparative Example 4 |
|---|---|---|---|---|---|---|---|---|---|---|
| Epoxy resin | N-770 | 39.7 | 41.1 | 43.5 | 39.7 | 36.4 | 35.5 | 47.9 | 50.7 | 53.4 |
| Active ester resin | B-3 | 60.3 | | | | | | | | |

TABLE 1-continued

|  |  | Example 5 | Example 6 | Example 7 | Example 8 | Example 9 | Example 10 | Comparative Example 2 | Comparative Example 3 | Comparative Example 4 |
|---|---|---|---|---|---|---|---|---|---|---|
|  | B-4 |  | 58.9 |  |  | 63.6 |  |  |  |  |
|  | B-5 |  |  | 56.5 |  |  |  |  |  |  |
|  | B-6 |  |  |  | 60.3 |  | 64.5 |  |  |  |
|  | B-7 |  |  |  |  |  |  | 52.1 |  |  |
| Phenolic hydroxyl | A-1 |  |  |  |  |  |  |  | 49.3 |  |
| group-containing resin | A-2 |  |  |  |  |  |  |  |  | 46.6 |
| Equivalent of carbonyloxy group in active ester resin per equivalent of epoxy group in epoxy resin |  | 1 | 1 | 1 | 1 | 1.2 | 1.2 | 1 | — |  |
| Hest resistance (° C.) |  | 177 | 192 | 230 | 189 | 197 | 194 | 131 | 189 | 140 |
| Dielectric constant (10 Hz) |  | 3.6 | 3.5 | 3.3 | 3.5 | 3.4 | 3.5 | 4.6 | 4.5 | 4.4 |
| Dielectric loss tangent (10 Hz) |  | 0.006 | 0.005 | 0.003 | 0.004 | 0.003 | 0.003 | 0.017 | 0.016 | 0.015 |
| Flame retardancy test class |  | V-1 | V-1 | V-1 | V-1 | V-1 | V-1 | Burning | V-1 | V-1 |
| *1 |  | 34 | 25 | 29 | 24 | 23 | 24 | 37 | 15 | 26 |
| *2 |  | 87 | 89 | 95 | 86 | 82 | 85 | 158 | 68 | 126 |

Note of Table 1:
B-3: active ester resin (B-3) produced in Example 1
B-4: active ester resin (B-4) produced in Example 2
B-5: active ester resin (B-5) produced in Example 3
B-6: active ester resin (B-6) produced in Example 4
B-7: active ester resin (B-7) produced in Comparative Example 1
N-770: phenol novolac epoxy resin ("N-770" manufactured by DIC Corporation, epoxy equivalent: 183 g/eq.)
A-1: phenolic hydroxyl group-containing phenol resin (A-1) produced in Synthesis Example 1
A-2: phenolic hydroxyl group-containing phenol resin (A-2) produced in Synthesis Example 2
*1: Maximum flaming combustion time (second) at each time of flame application
*2: Total flaming combustion time (second) of five test pieces The evaluation result shown by "Self-extinguishing" is a level in which flame retardancy ($\Sigma F \leq 250$ seconds and $F_{max} \leq 30$ seconds) required for V-1 is not satisfied, but the test piece extinguishes without reaching combustion (reaching a clamp of a flame).

The invention claimed is:

1. A thermosetting resin composition comprising an active ester resin (A) and an epoxy resin (B), wherein the active ester resin (A) is produced by reacting a phenolic hydroxyl group-containing resin (a1-1) with an aromatic monofunctional carboxylic acid or its chloride (a1-3) so as to leave phenolic hydroxyl groups in the resin (a1-1), and then reacting the reaction product with an aromatic dicarboxylic acid or aromatic dicarboxylic acid chloride (a1-2), the resin (a1-1) being a phenolic hydroxyl group-containing resin having a softening point of 70° C. to 200° C., phenolic hydroxyl groups at both ends thereof, and a structural unit (1') as a repeat unit represented by general formula (1') below,

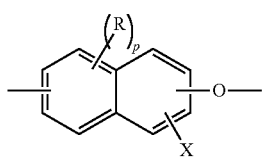

General Formula (1')

in the general formula (1'), a position of bonding to a naphthalene skeleton may be any one of the two rings constituting a naphthalene ring, in the general formula (1'), X represents a hydrogen atom or a structural site represented by general formula (1") below,

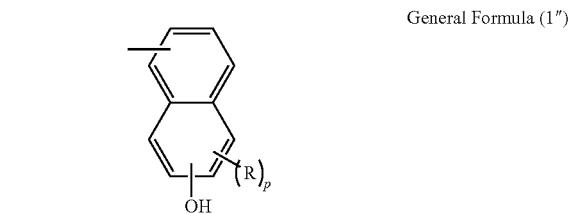

General Formula (1")

in the general formula (1') and general formula (1"), R represents a structural site (α') represented by general formula (2') below, and p is an integer of 0 to 2,

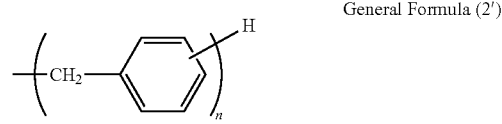

General Formula (2')

and in the general formula (2'), n is 1 or 2, the phenolic hydroxyl group-containing resin (a1-1) containing, in its molecular structure, the structural site (α') at a ratio of 0.1 to 1.0 in terms of number of sites per naphthalene ring.

2. A thermosetting resin composition comprising an active ester resin (A) and an epoxy resin (B), wherein the active ester resin (A) is produced by reacting a phenolic hydroxyl group-containing resin (a1-1) with a mixture of an aromatic monofunctional carboxylic acid or its chloride (a1-3) and an aromatic dicarboxylic acid or aromatic dicarboxylic acid chloride (a1-2), the resin (a1-1) being a phenolic hydroxyl group-containing resin having a softening point of 70° C. to 200° C., phenolic hydroxyl groups at both ends thereof, and a structural unit (1') as a repeat unit represented by general formula (1') below,

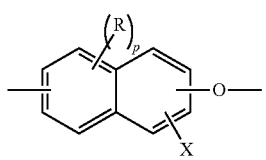

General Formula (1')

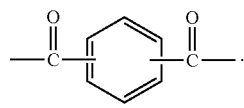

Structural Formula 3-2 in the general formula (1'), a position of bonding to a naphthalene skeleton may be any one of the two rings constituting a naphthalene ring, in the general formula (1'), X represents a hydrogen atom or a structural site represented by general formula (1") below,

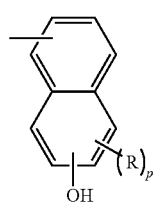

General Formula (1")

in the general formula (1') and general formula (1"), R represents a structural site (α') represented by general formula (2') below, and p is an integer of 0 to 2,

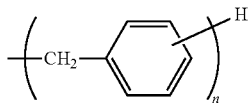

Structural Formula (2')

and in the general formula (2'), n is 1 or 2, the phenolic hydroxyl group-containing resin (a1-1) containing, in its molecular structure, the structural site (α') at a ratio of 0.1 to 1.0 in terms of number of sites per naphthalene ring.

3. A thermosetting resin composition comprising an active ester resin (A) and an epoxy resin (B), wherein the active ester resin (A) has a resin structure which has benzoyl groups at both ends and in which naphthylene ether structural sites (α) are bonded to each other through a structural site (β), the naphthylene ether structural sites (α) being represented by the following structural formula 3-1,

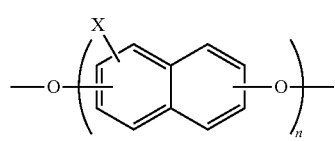

Structural Formula 3-1 wherein X represents a hydrogen atom or a benzoylnaphthyl group, and n is an integer of 2 or 3, the structural site (β) being represented by the following structural formula 3-2, 4. The thermosetting resin composition according to claim 1, 2 or 3, wherein the active ester resin (A) contains, in its resin structure, arylcarbonyloxy groups with a functional group equivalent in a range of 220 to 350 g/eq. in terms of monofunctional group equivalent.

5. A cured product produced by curing the epoxy resin composition according to claim 1, 2 or 3.

6. A semiconductor encapsulating material comprising a thermosetting resin composition further containing an inorganic filler (C) at a ratio of 70 to 95% by mass in the composition in addition to the active ester resin (A) and the epoxy resin (B) of the epoxy resin composition according to claim 1, 2 or 3.

7. A prepreg produced by impregnating a reinforcement substrate with the thermosetting resin composition according to claim 1, 2 or 3, which is diluted with an organic solvent, and then semi-curing the resultant impregnated substrate.

8. A circuit board produced by diluting the thermosetting resin composition according to claim 1, 2 or 3 with an organic solvent to prepare a varnish, shaping the varnish into a plate, and molding the plate and a copper foil under heating and pressure.

9. A build-up film produced by applying the thermosetting resin composition according to claim 1, 2 or 3, which is diluted with an organic solvent, to a base film and then drying the film.

10. An active ester resin having a resin structure produced by reacting a phenolic hydroxyl group-containing resin (a1-1) with an aromatic monofunctional carboxylic acid or its chloride (a1-3) so as to leave phenolic hydroxyl groups in the resin (a1-1), and then reacting the reaction product with an aromatic dicarboxylic acid or aromatic dicarboxylic acid chloride (a1-2), the resin (a1-1) being a phenolic hydroxyl group-containing resin having a softening point of 70° C. to 200° C., phenolic hydroxyl groups at both ends thereof, and a structural unit (I') as a repeat unit represented by general formula (1') below,

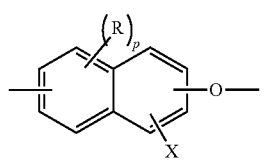

General Formula (1')

in the general formula (1'), a position of bonding to a naphthalene skeleton may be any one of the two rings constituting a naphthalene ring, in the general formula (1'), X represents a hydrogen atom or a structural site represented by general formula (1") below,

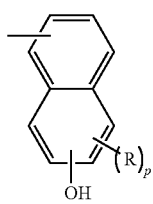

General Formula (1″)

in the general formula (1') and general formula (1″), R represents a structural site (α') represented by general formula (2') below, and p is an integer of 0 to 2,

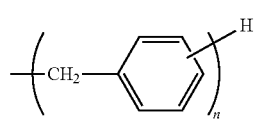

General Formula (2')

and in the general formula (2'), n is 1 or 2, the phenolic hydroxyl group-containing resin (a1-1) containing, in its molecular structure, the structural site (α') at a ratio of 0.1 to 1.0 in terms of number of sites per naphthalene ring.

11. An active ester resin (A) having a resin structure produced by reacting a phenolic hydroxyl group-containing resin (a1-1) with a mixture of an aromatic monofunctional carboxylic acid or its chloride (a1-3) and an aromatic dicarboxylic acid or aromatic dicarboxylic acid chloride (a1-2), the resin (a1-1) being a phenolic hydroxyl group-containing resin having a softening point of 70° C. to 200° C., phenolic hydroxyl groups at both ends thereof, and a structural unit (I') as a repeat unit represented by general formula (1') below,

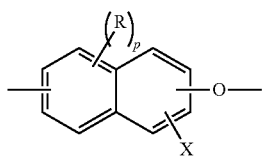

General Formula (1')

in the general formula (1'), a position of bonding to a naphthalene skeleton may be any one of the two rings constituting a naphthalene ring, in the general formula (1'), X represents a hydrogen atom or a structural site represented by general formula (1″) below,

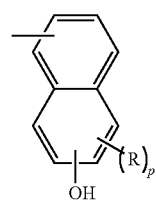

General Formula (1″)

in the general formula (1') and general formula (1″), R represents a structural site (α') represented by general formula (2') below, and p is an integer of 0 to 2,

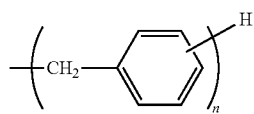

General Formula (2')

and in the general formula (2'), n is 1 or 2, the phenolic hydroxyl group-containing resin (a1-1) containing, in its molecular structure, the structural site (α') at a ratio of 0.1 to 1.0 in terms of number of sites per naphthalene ring.

12. An active ester resin having a resin structure which has benzoyl groups at both ends and in which naphthylene ether structural sites (α) are bonded to each other through a structural site (β), the naphthylene ether structural sites (α) being represented by the following structural formula 3-1,

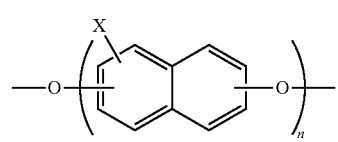

Structural Formula 3-1 wherein X represents a hydrogen atom or a benzoylnaphthyl group, and n is an integer of 2 or 3, the structural site (β) being represented by the following structural formula 3-2,

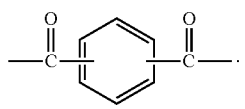

Structural Formula 3-2

* * * * *